United States Patent
Tao et al.

(10) Patent No.: US 10,515,975 B1
(45) Date of Patent: Dec. 24, 2019

(54) METHOD FOR FORMING DUAL-DECK CHANNEL HOLE STRUCTURE OF THREE-DIMENSIONAL MEMORY DEVICE

(71) Applicant: Yangtze Memory Technologies Co., Ltd., Wuhan, Hubei (CN)

(72) Inventors: Qian Tao, Hubei (CN); Yushi Hu, Hubei (CN); Zhenyu Lu, Hubei (CN); Li Hong Xiao, Hubei (CN); Jun Chen, Hubei (CN); Xiaowang Dai, Hubei (CN); Jin Lyu, Hubei (CN); Jifeng Zhu, Hubei (CN); Jin Wen Dong, Hubei (CN); Lan Yao, Hubei (CN)

(73) Assignee: Yangtze Memory Technologies Co., Ltd., Wuhan, Hubei (CN)

( * ) Notice: Subject to any disclaimer, the term of this patent is extended or adjusted under 35 U.S.C. 154(b) by 0 days.

(21) Appl. No.: 16/046,887

(22) Filed: Jul. 26, 2018

Related U.S. Application Data

(63) Continuation of application No. PCT/CN2018/090426, filed on Jun. 8, 2018.

(51) Int. Cl.
*H01L 27/11556* (2017.01)
*H01L 27/11582* (2017.01)
(Continued)

(52) U.S. Cl.
CPC .... *H01L 27/11556* (2013.01); *H01L 23/5226* (2013.01); *H01L 23/53271* (2013.01); *H01L 27/11582* (2013.01); *H01L 21/32134* (2013.01)

(58) Field of Classification Search
None
See application file for complete search history.

(56) References Cited

U.S. PATENT DOCUMENTS 7,629,247 B2    12/2009  Hsia et al.
10,103,169 B1*  10/2018  Ge ............... H01L 27/11582
(Continued)

FOREIGN PATENT DOCUMENTS

CN    101689551 A    3/2010
CN    105261617 A    1/2016
(Continued)

OTHER PUBLICATIONS

International Search Report and Written Opinion of the International Searching Authority directed to related International Patent Application No. PCT/CN2018/090426, dated Mar. 6, 2019; 8 pages.

*Primary Examiner* — Thien F Tran
(74) *Attorney, Agent, or Firm* — Sterne, Kessler, Goldstein & Fox P.L.L.C.

(57) ABSTRACT

A method for forming a channel hole structure of a 3D memory device is disclosed. The method includes: forming a first alternating dielectric stack and a first insulating layer on a substrate; forming a first channel structure in a first channel hole penetrating the first insulating layer and the first alternating dielectric stack; forming a sacrificial inter-deck plug in the first insulating layer; forming a second alternating dielectric stack on the sacrificial inter-deck plug; forming a second channel hole penetrating the second alternating dielectric stack and expose a portion of the sacrificial inter-deck plug; removing the sacrificial inter-deck plug to form a cavity; and forming an inter-deck channel plug in the cavity and a second channel structure in the second channel hole, the inter-deck channel plug contacts the first channel structure and the second channel structure.

20 Claims, 22 Drawing Sheets

(51) Int. Cl.
  *H01L 23/532*      (2006.01)
  *H01L 23/522*      (2006.01)
  *H01L 21/3213*     (2006.01)

(56)          References Cited

U.S. PATENT DOCUMENTS

2012/0280298 A1    11/2012  Park et al.
2012/0299005 A1    11/2012  Lee
2012/0299082 A1    11/2012  Park
2015/0008506 A1     1/2015  Yang et al.
2016/0005760 A1     1/2016  Lee et al.
2017/0025431 A1     1/2017  Kanakamedala et al.
2018/0315769 A1 *  11/2018  Huo .................. H01L 29/10
2019/0074291 A1 *   3/2019  Lu ................ H01L 27/11582
2019/0081060 A1 *   3/2019  Lu ................ H01L 27/11565

FOREIGN PATENT DOCUMENTS

CN        106887435 A     6/2017
CN        106920772 A     7/2017

* cited by examiner

METHOD FOR FORMING DUAL-DECK CHANNEL HOLE STRUCTURE OF THREE-DIMENSIONAL MEMORY DEVICE

CROSS-REFERENCE TO RELATED APPLICATIONS

This application claims priority to PCT/CN2018/090426 filed on Jun. 8, 2018, the entire contents of which are incorporated herein by reference.

TECHNICAL FIELD

The present disclosure generally relates to the field of semiconductor technology, and more particularly, to a method for forming a dual-deck channel hole structure of three-dimensional (3D) memory devices.

BACKGROUND

Planar memory cells are scaled to smaller sizes by improving process technology, circuit design, programming algorithm, and fabrication process. However, as feature sizes of the memory cells approach a lower limit, planar process and fabrication techniques become challenging and costly. As such, memory density for planar memory cells approaches an upper limit. A three-dimensional (3D) memory architecture can address the density limitation in planar memory cells.

As semiconductor technology advances, 3D memory devices, such as 3D NAND memory devices, keep scaling more oxide/nitride (ON) layers. As a result, etching processes of channel holes become more and more challenging.

BRIEF SUMMARY

Embodiments of a method for forming a dual-deck channel hole structure of three-dimensional (3D) memory devices are disclosed herein.

The method includes: forming a first alternating dielectric stack on a substrate; forming a first insulating layer on the first alternating dielectric stack; forming a first channel hole penetrating the first insulating layer and the first alternating dielectric stack; forming a first channel structure in the first channel hole; forming a sacrificial inter-deck plug in the first insulating layer, wherein a projection of the sacrificial inter-deck plug in a lateral plane covers a projection of the first channel hole in the lateral plane; forming a second alternating dielectric stack disposed on the sacrificial inter-deck plug; forming a second channel hole penetrating the second alternating dielectric stack and expose a portion of the sacrificial inter-deck plug; removing the sacrificial inter-deck plug to form a cavity; and forming an inter-deck channel plug in the cavity and a second channel structure in the second channel hole, wherein the inter-deck channel plug contacts the first channel structure and the second channel structure.

In some embodiments, the method further comprises: forming at least 32 dielectric layer pairs stacked in a vertical direction, wherein each dielectric layer pair includes a first dielectric layer and a second dielectric layer that is different from the first dielectric layer.

In some embodiments, the method further comprises: forming at least 32 dielectric layer pairs stacked in a vertical direction, wherein each dielectric layer pair includes a silicon oxide layer and a silicon nitride layer.

In some embodiments, the method further comprises: forming an oxide layer on the first alternating dielectric stack as the first insulating layer; and forming a nitride layer on the oxide layer as a first mask layer.

In some embodiments, the method further comprises: before forming the first channel structure, forming an epitaxial layer on a surface of the substrate that is exposed by the first channel hole.

In some embodiments, forming the first channel structure comprises: forming a first functional layer on a sidewall of the first channel hole; forming a first channel layer covering a sidewall of the functional layer, the first channel layer being in contact with the epitaxial layer; and forming a first filling structure to cover a sidewall of the first channel layer and filling the first channel hole.

In some embodiments, forming the first functional layer comprises: forming a first barrier layer on the sidewall of the first channel hole for blocking an outflow of electronic charges; forming a first storage layer on a surface of the first barrier layer for storing electronic charges during operation of the 3D memory device; and forming a first tunneling layer on a surface of the first storage layer for tunneling electronic charges.

In some embodiments, forming the sacrificial inter-deck plug comprises: forming a first recess in the first insulating layer, wherein a projection of the first recess in the lateral plane covers a projection of the first channel hole in the lateral plane; forming an oxide and nitride etch stopper layer in the first recess, the oxide and nitride etch stopper layer be in contact with the first channel layer; and removing a portion of the oxide and nitride etch stopper layer that is outside of the recess to form the sacrificial inter-deck plug, and to planarize a top surface of the sacrificial inter-deck plug.

In some embodiments, the method further comprises: forming the sacrificial inter-deck plug comprises: depositing a material including tungsten, tungsten silicide, or tungsten nitride to form the oxide and nitride etch stopper layer.

In some embodiments, removing the sacrificial inter-deck plug comprises: performing a selective wet etching process to etch the sacrificial inter-deck plug through the second channel hole.

In some embodiments, before removing the sacrificial inter-deck plug, the method further comprises: forming a second functional layer on a sidewall of the second channel hole and on a surface of the sacrificial inter-deck plug exposed by the second channel hole; and removing a portion of the second functional layer that is on a surface of the sacrificial inter-deck plug.

In some embodiments, forming the second functional layer comprises: forming a second barrier layer on the sidewall of the second channel hole for blocking an outflow of the electronic charges; forming a second storage layer on a surface of the second barrier layer for storing electronic charges during operation of the 3D memory device; and forming a second tunneling layer on a surface of the second storage layer for tunneling electronic charges.

In some embodiments, forming the inter-deck channel plug comprises: forming the inter-deck channel plug in the cavity by a deposition process, wherein the inter-deck channel plug contacts the first channel layer.

In some embodiments, forming the second channel structure in the first channel hole comprises: forming the second channel layer on a surface of the second functional layer by a deposition process, wherein the second channel structure contacts the inter-deck channel plug.

In some embodiments, forming the inter-deck channel plug in the cavity and the second channel structure in the first channel hole comprises: forming the inter-deck channel plug and the second channel structure in a single deposition process.

In some embodiments, forming the inter-deck channel plug comprises: forming the inter-deck channel plug having a thickness less than 60 nm.

In some embodiments, forming the second channel structure further comprises: forming a second filling structure to cover a sidewall of the second channel layer and filling the second channel hole.

In some embodiments, the method further comprises: removing a portion of the second filling structure a second recess in the second channel hole; and forming a top channel plug in the second recess, the top channel plug being in contact with the second channel layer.

In some embodiments, the method further comprises: replacing the second dielectric layers in the first alternating dielectric stack and the second alternating dielectric stack with conductor layers.

In some embodiments, the method further comprises: reducing a thickness of the inter-deck channel plug during replacing the second dielectric layers in the first alternating dielectric stack and the second alternating dielectric stack with conductor layers.

Other aspects of the present disclosure can be understood by those skilled in the art in light of the description, the claims, and the drawings of the present disclosure.

BRIEF DESCRIPTION OF THE DRAWINGS

The accompanying drawings, which are incorporated herein and form a part of the specification, illustrate embodiments of the present disclosure and, together with the description, further serve to explain the principles of the present disclosure and to enable a person skilled in the pertinent art to make and use the present disclosure.

Figure 1A:
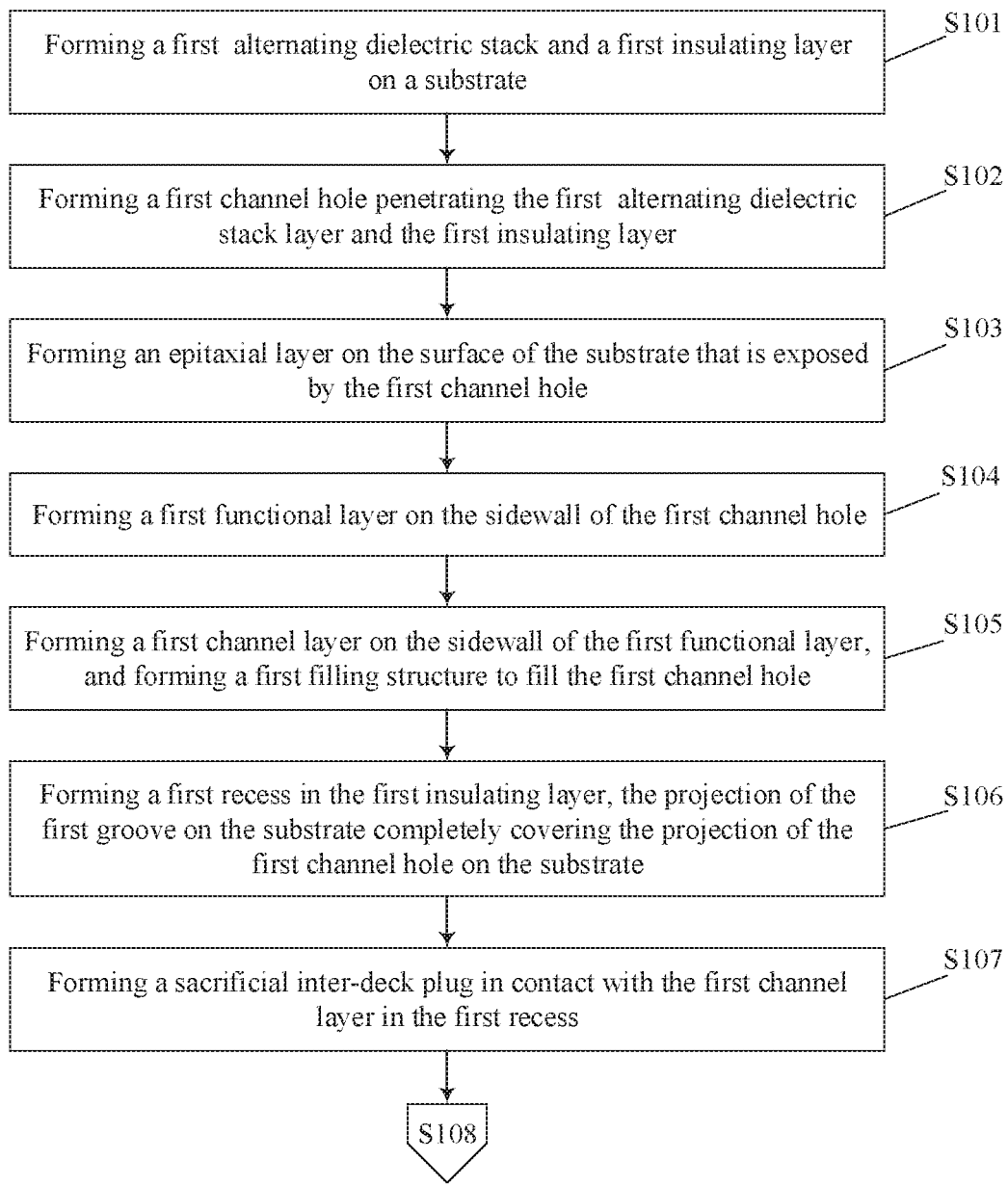
FIGS. 1A-1B illustrate flow diagrams of an exemplary method for forming a dual-deck channel hole structure of a 3D memory device in accordance with some embodiments of the present disclosure.

Embodiments of the present disclosure will be described with reference to the accompanying drawings.

DETAILED DESCRIPTION

Although specific configurations and arrangements are discussed, it should be understood that this is done for illustrative purposes only. A person skilled in the pertinent art will recognize that other configurations and arrangements can be used without departing from the spirit and scope of the present disclosure. It will be apparent to a person skilled in the pertinent art that the present disclosure can also be employed in a variety of other applications.

It is noted that references in the specification to "one embodiment," "an embodiment," "an example embodiment," "some embodiments," etc., indicate that the embodiment described may include a particular feature, structure, or characteristic, but every embodiment may not necessarily include the particular feature, structure, or characteristic. Moreover, such phrases do not necessarily refer to the same embodiment. Further, when a particular feature, structure or characteristic is described in connection with an embodiment, it would be within the knowledge of a person skilled in the pertinent art to effect such feature, structure or characteristic in connection with other embodiments whether or not explicitly described.

In general, terminology may be understood at least in part from usage in context. For example, the term "one or more" as used herein, depending at least in part upon context, may be used to describe any feature, structure, or characteristic in a singular sense or may be used to describe combinations of features, structures or characteristics in a plural sense. Similarly, terms, such as "a," "an," or "the," again, may be understood to convey a singular usage or to convey a plural usage, depending at least in part upon context.

It should be readily understood that the meaning of "on," "above," and "over" in the present disclosure should be interpreted in the broadest manner such that "on" not only means "directly on" something but also includes the meaning of "on" something with an intermediate feature or a layer therebetween, and that "above" or "over" not only means the meaning of "above" or "over" something but can also include the meaning it is "above" or "over" something with no intermediate feature or layer therebetween (i.e., directly on something).

Further, spatially relative terms, such as "beneath," "below," "lower," "above," "upper," and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

As used herein, the term "substrate" refers to a material onto which subsequent material layers are added. The substrate itself can be patterned. Materials added on top of the substrate can be patterned or can remain unpatterned. Furthermore, the substrate can include a wide array of semiconductor materials, such as silicon, germanium, gallium arsenide, indium phosphide, etc. Alternatively, the substrate can be made from an electrically non-conductive material, such as a glass, a plastic, or a sapphire wafer.

As used herein, the term "layer" refers to a material portion including a region with a thickness. A layer can extend over the entirety of an underlying or overlying structure, or may have an extent less than the extent of an underlying or overlying structure. Further, a layer can be a region of a homogeneous or inhomogeneous continuous structure that has a thickness less than the thickness of the continuous structure. For example, a layer can be located between any pair of horizontal planes between, or at, a top surface and a bottom surface of the continuous structure. A layer can extend horizontally, vertically, and/or along a tapered surface. A substrate can be a layer, can include one or more layers therein, and/or can have one or more layer thereupon, thereabove, and/or therebelow. A layer can include multiple layers. For example, an interconnection layer can include one or more conductor and contact layers (in which contacts, interconnect lines, and/or vias are formed) and one or more dielectric layers.

As used herein, the term "nominal/nominally" refers to a desired, or target, value of a characteristic or parameter for a component or a process operation, set during the design phase of a product or a process, together with a range of values above and/or below the desired value. The range of values can be due to slight variations in manufacturing processes or tolerances. As used herein, the term "about" indicates the value of a given quantity that can vary based on a particular technology node associated with the subject semiconductor device. Based on the particular technology node, the term "about" can indicate a value of a given quantity that varies within, for example, 11-30% of the value (e.g., ±10%, ±20%, or ±30% of the value).

As used herein, the term "3D memory device" refers to a semiconductor device with vertically-oriented strings of memory cell transistors (i.e., region herein as "memory strings." such as NAND strings) on a laterally-oriented substrate so that the memory strings extend in the vertical direction with respect to the substrate. As used herein, the term "vertical/vertically" means nominally perpendicular to a lateral surface of a substrate.

Various embodiments in accordance with the present disclosure provide a 3D memory device with a dual-deck channel hole array structure for a memory array (also referred to herein as an "array device") and fabricating methods for forming the dual-deck channel hole array structure.

In some embodiments, a joint channel hole structure can be formed to penetrate a dual-deck alternating stack including a plurality of conductive/dielectric pairs or a plurality of oxide/nitride pairs. The number of the conductive/dielectric pairs or oxide/nitride pairs can be larger than or equal to 32, such as 64, 96, 128, 160, etc. By combining two channel hole formation processes, and forming an inter-deck channel plug, a dual-deck channel hole structure having a large aspect ratio and a limited top-bottom aperture error can be formed.

By replacing a sacrificial inter-deck plug, a polycrystalline silicon (polysilicon) inter-deck channel plug can be formed between an upper deck and a lower deck of the dual-deck alternating stack to electrically connect with the channel layers in the joint channel hole structure. The inter-deck channel plug can have a robust structure strength, and a limited thickness less than 60 nm. As such, the channel mobility and the string current of the 3D memory device can be significantly improved. Further, the inter-deck plug can have an enlarged dimension to increase top-bottom deck overlay margin. As such, the polysilicon inter-deck channel plug can provide a reliable electrical connection between the channel layers in the joint channel hole structure and an increased area for contact alignment in the subsequent processes.

Figure 1B:
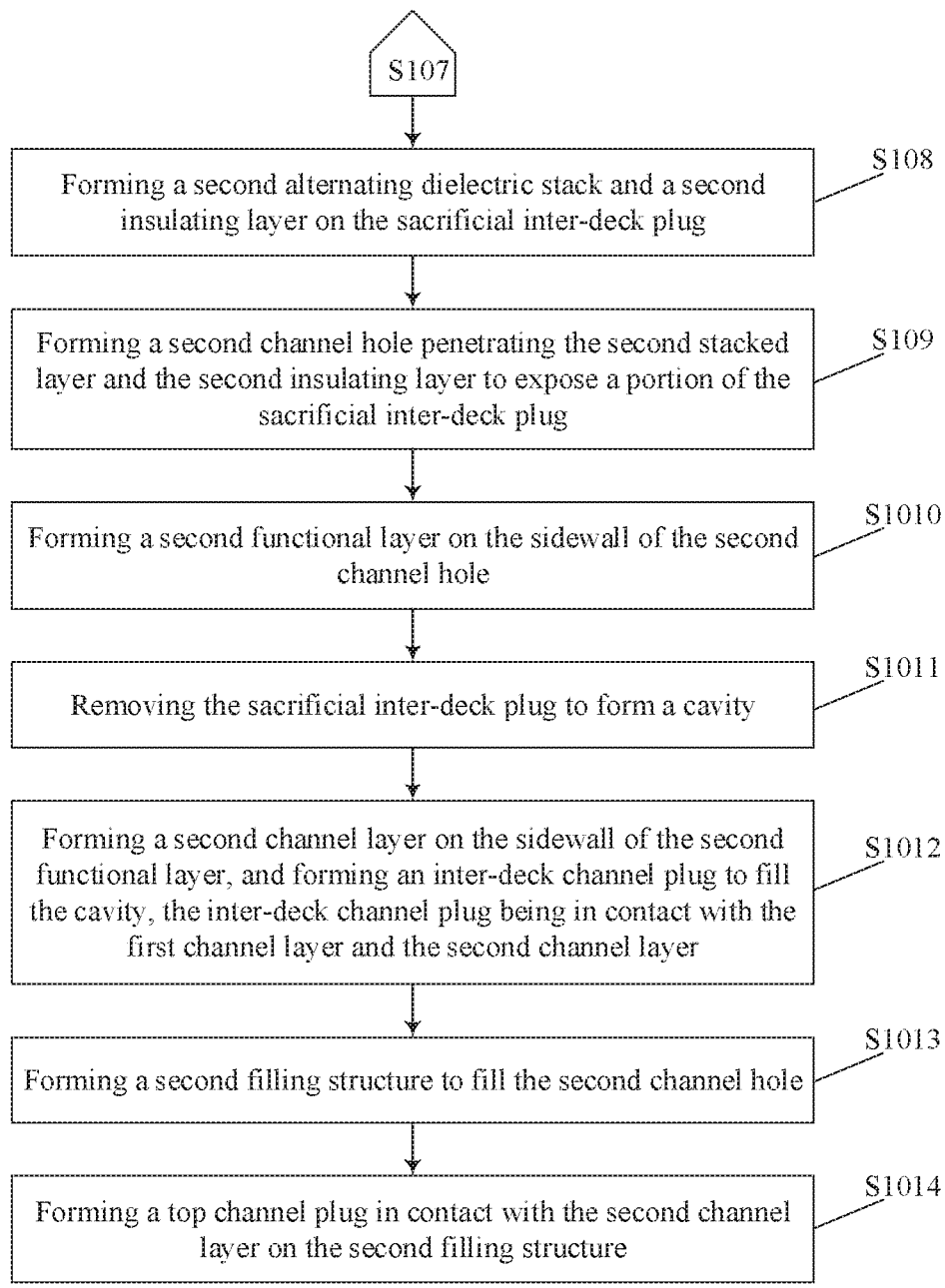
Figure 2A:
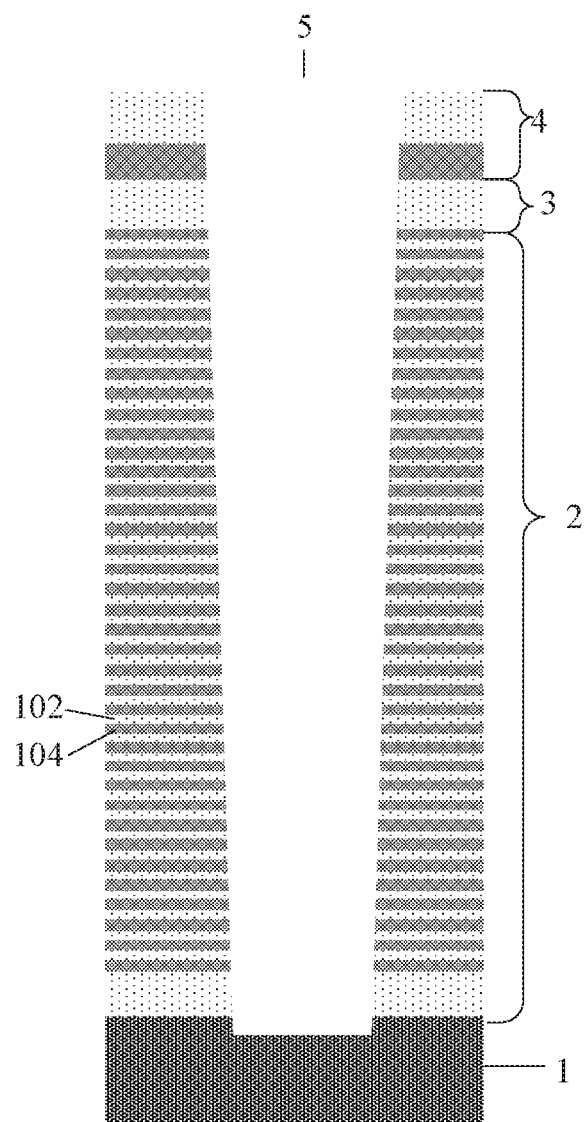
FIGS. 2A-2T illustrate cross-sectional views of an exemplary dual-deck channel hole structure of a 3D memory device at certain fabricating stages of the method shown in FIGS. 1A-1B.

Referring to FIGS. 1A and 1B, a flow diagram of an exemplary method for forming a dual-deck channel hole structure of a 3D memory device is shown in accordance with some embodiments of the present disclosure. FIGS. 2A-2T illustrate cross-sectional views of an exemplary dual-deck channel hole structure of a 3D memory device at certain fabricating stages of the method shown in FIGS. 1A and 1B.

As shown in FIG. 1A, the method can start at operation S101, in which a first alternating dielectric stack and a first insulating layer can be formed on the surface of a substrate. In some embodiments, the substrate can be any suitable semiconductor substrate having any suitable structure, such as a monocrystalline single-layer substrate, a polycrystalline silicon (polysilicon) single-layer substrate, a polysilicon and metal multi-layer substrate, etc.

As shown in FIG. 2A, the first alternating dielectric stack 2 including a plurality of dielectric layer pairs can be formed on the substrate 1. The first alternating dielectric stack 2 can include an alternating stack of a first dielectric layer 102 (e.g., of silicon oxide) and a second dielectric layer 104 (e.g., of silicon nitride) that is different from first dielectric layer. The plurality of first dielectric layers 102 and second dielectric layers 104 are extended in a lateral direction that is parallel to a surface of the substrate 1. In some embodiments, there are more layers than the dielectric layer pairs made of different materials and with different thicknesses in the first alternating dielectric stack 2. The first alternating dielectric stack 2 can be formed by one or more thin film deposition processes including, but not limited to, Chemical Vapor Deposition (CVD), Physical Vapor Deposition (PVD), Atomic Layer Deposition (ALD), or any combination thereof.

In some embodiments, the first alternating dielectric stack 2 can include a plurality of oxide/nitride layer pairs. Each dielectric layer pair includes a layer of silicon oxide 102 and a layer of silicon nitride 104. The plurality of oxide/nitride layer pairs are also referred to herein as an "alternating oxide/nitride stack." That is, in the first alternating dielectric stack 2, multiple oxide layers 102 (shown in the areas with dotes) and multiple nitride layers 104 (shown in the areas with meshes) alternate in a vertical direction. In other words, except a top and a bottom layer of a given alternating oxide/nitride stack, each of the other oxide layers 102 can be sandwiched by two adjacent nitride layers 104, and each of the nitride layers 104 can be sandwiched by two adjacent oxide layers 102.

Oxide layers can each have the same thickness or have different thicknesses. For example, a thickness of each oxide layer can be in a range from 10 nm to 100 nm, preferably about 30 nm. Similarly, nitride layers can each have the same thickness or have different thicknesses. For example, a thickness of each nitride layer can be in a range from 10 nm to 100 nm, preferably about 35 nm.

It is noted that, in the present disclosure, the oxide layers 102 and/or nitride layers 104 can include any suitable oxide materials and/or nitride materials. For example, the oxide materials can include silicides, and the element of nitride materials can include, but not limited to, tungsten (W), cobalt (Co), copper (Cu), aluminum (Al), doped silicon, silicides, or any combination thereof. In some embodiments, the oxide layers can be silicon oxide layers, and the nitride layers can be silicon nitride layer.

The first alternating dielectric stack 2 can include any suitable number of layers of the oxide layers 102 and the nitride layers 104. In some embodiments, a total number of layers of the oxide layers 102 and the nitride layers 104 in the first alternating dielectric stack 2 is equal to or larger than 64. That is, a number of oxide/nitride layer pairs can be equal to or larger than 32. In some embodiments, alternating oxide/nitride stack includes more oxide layers or more nitride layers with different materials and/or thicknesses than the oxideinitride layer pair.

The first insulating layer 3 can be formed on the first alternating dielectric stack 2. In some embodiments, the first insulating layer 3 can be made by any suitable insulating material and/or dielectric material, such as silicon oxide. It is noted that, the material of the first insulating layer 3 can be different from the material of the nitride layer in the first alternating dielectric stack 2. The first insulating layer 3 can be formed on the top surface of the alternating dielectric stack 2.

Further, in some embodiments, a first hard mask layer 4 can be formed on the top surface of the first insulating layer 3. The first hard mask layer 4 can include a nitride layer on the top surface of the first insulating layer 3, and an oxide layer on the top surface of such nitride layer. The nitride layer of the first hard mask layer 4 can be a silicon nitride layer.

In some embodiments, the first alternating dielectric stack 2, the first insulating layer 3, and/or the first hard mask layer 4 can be formed by using one or more deposition processes. It is noted that, the term "deposition process" used in the present disclosure can be referred to any suitable deposition process including, but not limited to, a chemical vapor deposition (CVD) process, a physical vapor deposition (PVD) process, an atomic layer deposition (ALD) process, and/or any suitable combination thereof.

As shown in FIG. 1A, the method can process to operation S102, in which a first channel hole 5 can be formed. As shown in FIG. 2A, the first channel hole 5 can completely penetrate the first alternating dielectric stack 2 and the first insulating layer 3, and can extend into substrate 1. In some embodiments, the first channel hole 5 can be formed by etching the first alternating dielectric stack 2 and the first insulating layer 3 and a subsequent cleaning process. The etching process to form the first channel hole 5 can be a dry etching, or a combination of a wet etching and a following cleaning process. In some embodiments, when the first hard mask layer 4 is formed on the top surface of the first insulating layer 3, the etching process also etch the first hard mask layer 4 to form the first channel holes 5.

Figure 2B:
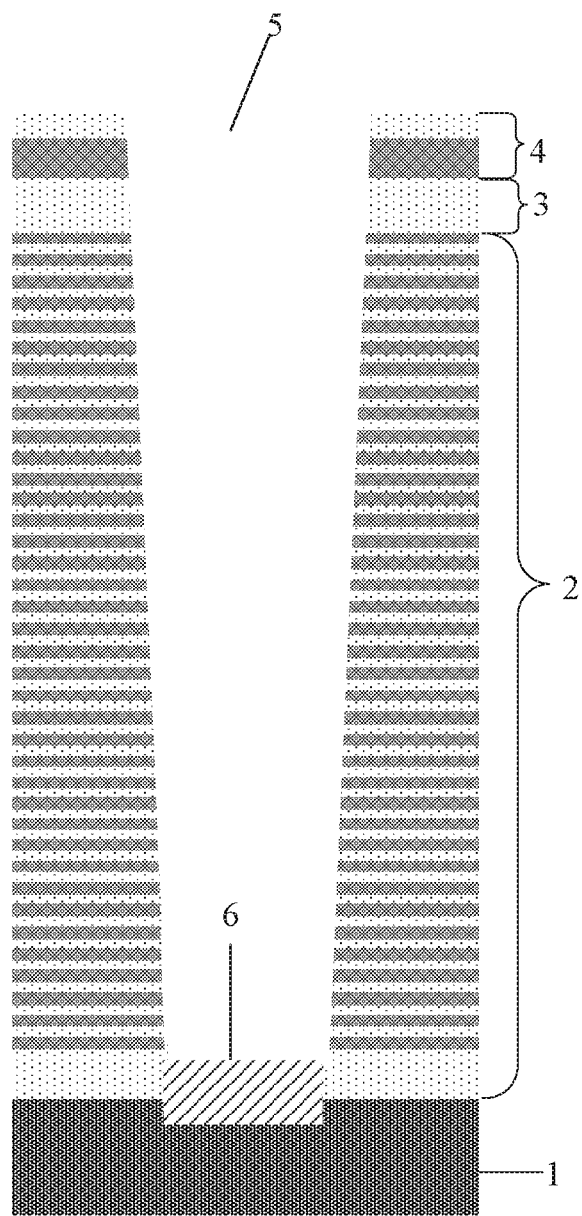

As shown in FIG. 1A, the method can process to operation S103, in which an epitaxial layer 6 can be formed upwards the substrate 1 that is exposed by the first channel hole 5, as shown in FIG. 2B. In some embodiments, the epitaxial layer 6 can be a polycrystalline silicon (polysilicon) layer formed by using a selective epitaxial growth (SEG) process. In some embodiments, the epitaxial layer 6 may not directly form on the surface of the substrate 1. One or more layers can be formed between the epitaxial layer 6 and the substrate 1. That is, the epitaxial layer 6 overlays the substrate 1.

As shown in FIG. 1A, the method can process to operation S104, in which a first functional layer can be formed on the sidewall of the first channel hole 5. The first functional layer can include a first barrier layer 7, a first storage layer 8, a first tunneling layer 9, and a first passivation layer 10. In some embodiments, the first functional layer can also be referred to a charge trapping layer.

Figure 2C:
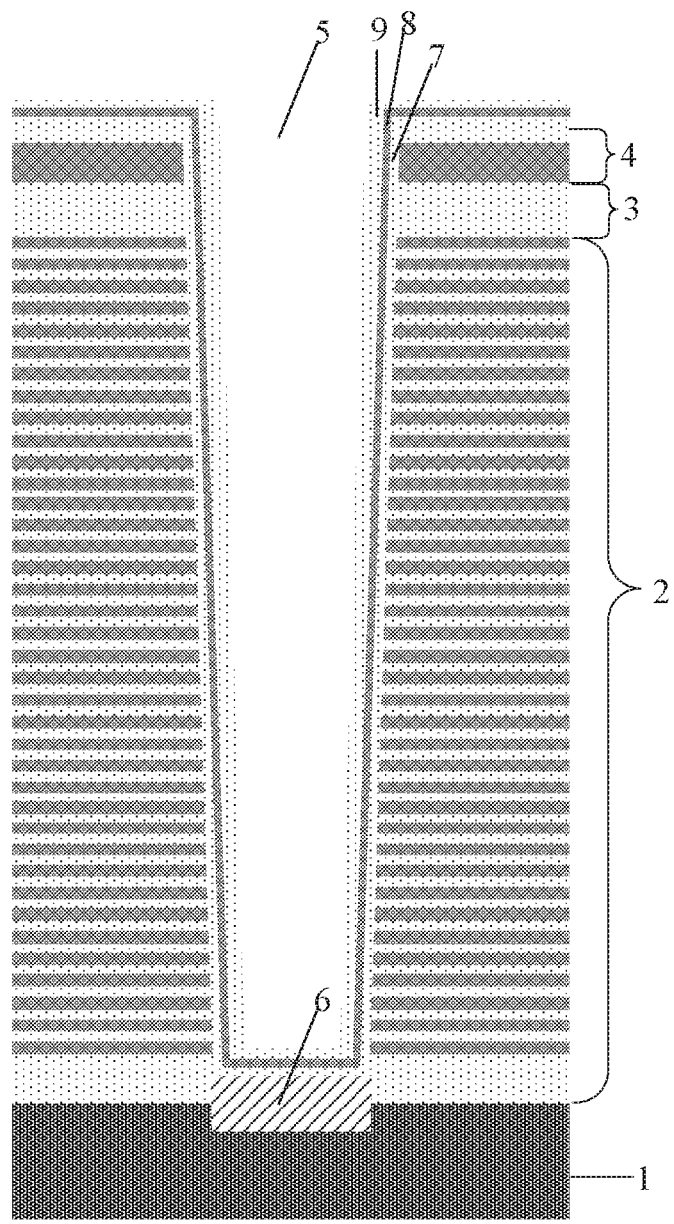

As shown in FIG. 2C, the first barrier layer 7 can be formed on the sidewall of the first channel hole 5 and the top surface of the epitaxial layer 6. The first barrier layer 7 can be used for blocking the outflow of the electronic charges. In some embodiments, the first barrier layer 7 can be a silicon oxide layer or a combination of silicon oxide/silicon oxynitride/silicon oxide ($SiO_2$—SiON—$SiO_2$) layers. In some embodiments, the first barrier layer 7 includes high dielectric constant (high-k) dielectrics (e.g., aluminum oxide). In one example, the first barrier layer 7 is mainly an oxide layer formed by In-Situ Steam Generation (ISSG) oxidation after a silicon nitride deposition process. In some embodiments, a thickness of the first barrier layer 7 can be less than 20 nm.

The first storage layer 8 can be formed on the surface of the first barrier layer 7. The first storage layer 8 can be used for storing electronic charges. The storage and/or removal of charge in the first storage layer 7 can impact the on/off state and/or a conductance of the semiconductor channel. The first storage layer 7 can include polycrystalline silicon (polysilicon) or silicon nitride. The first storage layer 8 can include one or more films of materials including, but are not limited to, silicon nitride, silicon oxynitride, a combination of silicon oxide and silicon nitride, or any combination thereof. In some embodiments, the first storage layer 8 can include a nitride layer formed by using one or more deposition processes. In some embodiments, a thickness of the first storage layer 8 can be less than 20 nm.

The first tunneling layer 9 can be formed on the surface of the first storage layer 8. The first tunneling layer 9 can be used for generating electronic charges (electrons or holes). The first tunneling layer 9 can include dielectric materials including, but not limited to, silicon oxide, silicon nitride, silicon oxynitride, or any combination thereof. In some embodiments, the first tunneling layer 9 can be an oxide layer formed by using a deposition process. In some embodiments, a thickness of the first tunneling layer 9 can be less than 20 nm.

Figure 2D:
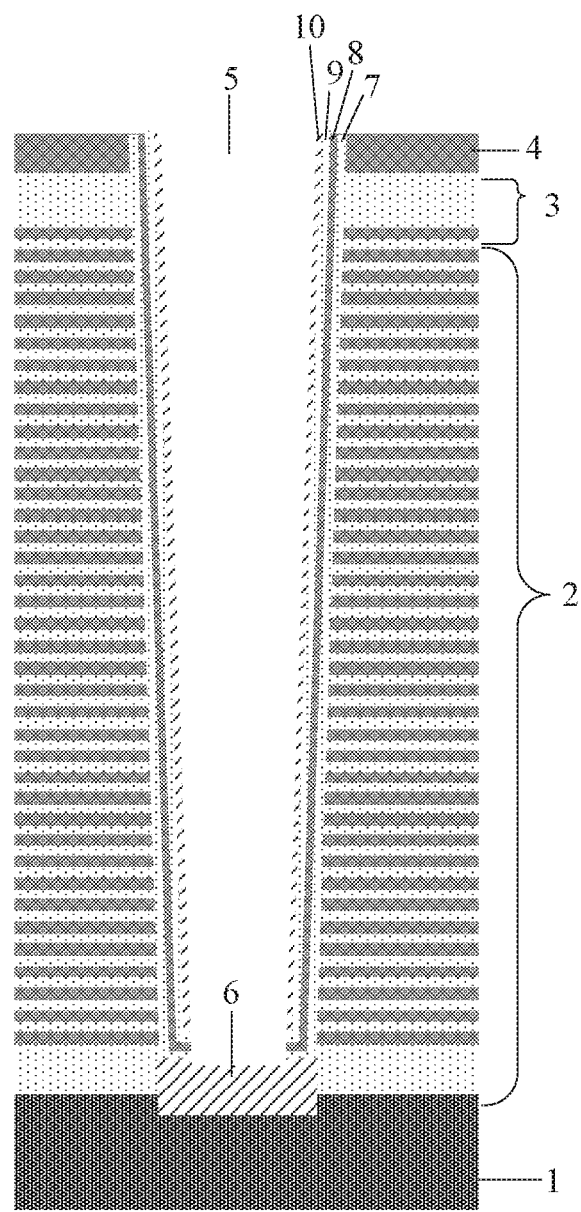

As shown in FIG. 2D, in some embodiments, a first passivation layer 10 can be formed on the surface of the first tunneling layer 9. The first passivation layer 10 can be used for protecting the first tunneling layer 9 from being damaged in a subsequent removal process. In some embodiments, the first passivation layer 10 can be an amorphous silicon layer formed by using a deposition process. In some embodiments, an additional capping oxide layer can be coated on the first passivation layer 10. It is noted that, in some other embodiments, the first passivation layer 10 can be omitted.

The portions of the first barrier layer 7, the first storage layer 8, the first tunneling layer 9, and the first passivation layer 10 located on the top surface of the epitaxial layer 6 on the bottom of the first channel hole 5 can be removed, which is normally called "Si-Oxide-Nitride-Oxide (SONO) Punch". In some embodiments, the removal process can include an etching process and a cleaning process. As such, the first functional layer can be formed on the sidewall of the first channel hole 5 and electrically connected to the epitaxial layer 6.

In some embodiment, in the same removal process, the first barrier layer 7, the first storage layer 8, the first tunneling layer 9, and the oxide layer of the first hard mask layer 4 located on the surface of the nitride layer of first hard mask layer 4 can also be removed. As such, the nitride layer of first hard mask layer 4 is remained on the surface of the first insulating layer 3.

As shown in FIG. 1A, the method can process to operation S105, in which a first channel layer can be formed on the sidewall of the first functional layer and the exposed surface of the epitaxial layer, and a first filling structure can be formed to fill the first channel hole.

Figure 2E:
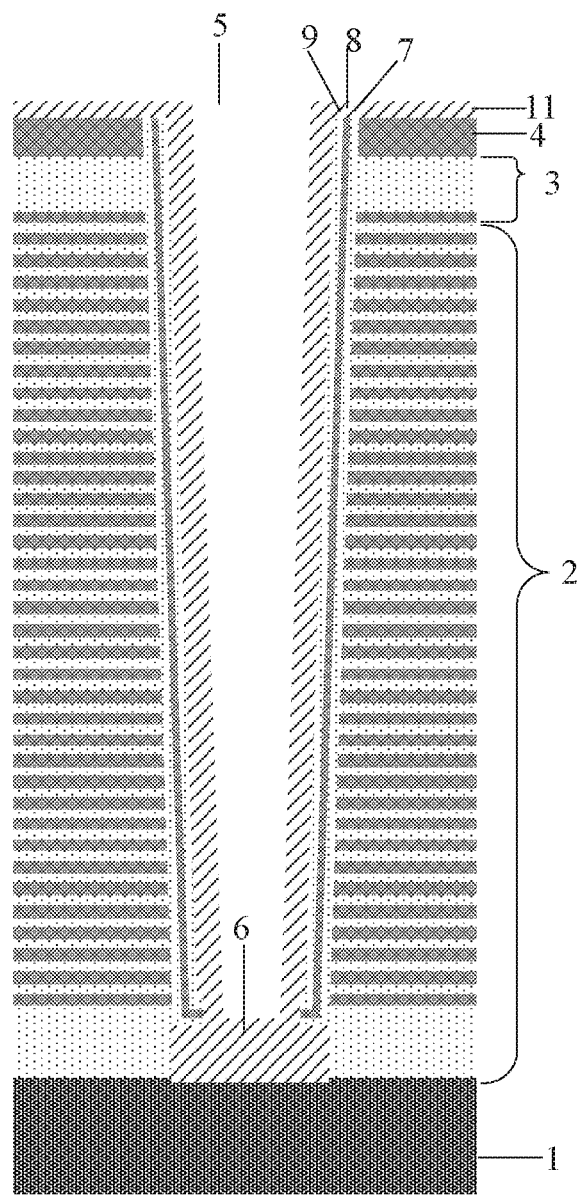

As shown in FIG. 2E, a first channel layer 11 can be formed to cover the sidewall of the first passivation layer 10 and the top surface of the epitaxial layer 6. The first channel layer 11 can cover the top surface of the nitride layer of the first hard mask layer 4. In some embodiments, the first channel layer 11 can be an amorphous silicon layer or a polysilicon layer formed by using a thin film deposition process, such as ALD, CVD, PVD, or any other suitable processes. In some embodiments, a thickness of the first channel layer 11 can be less than 20 nm.

Figure 2F:
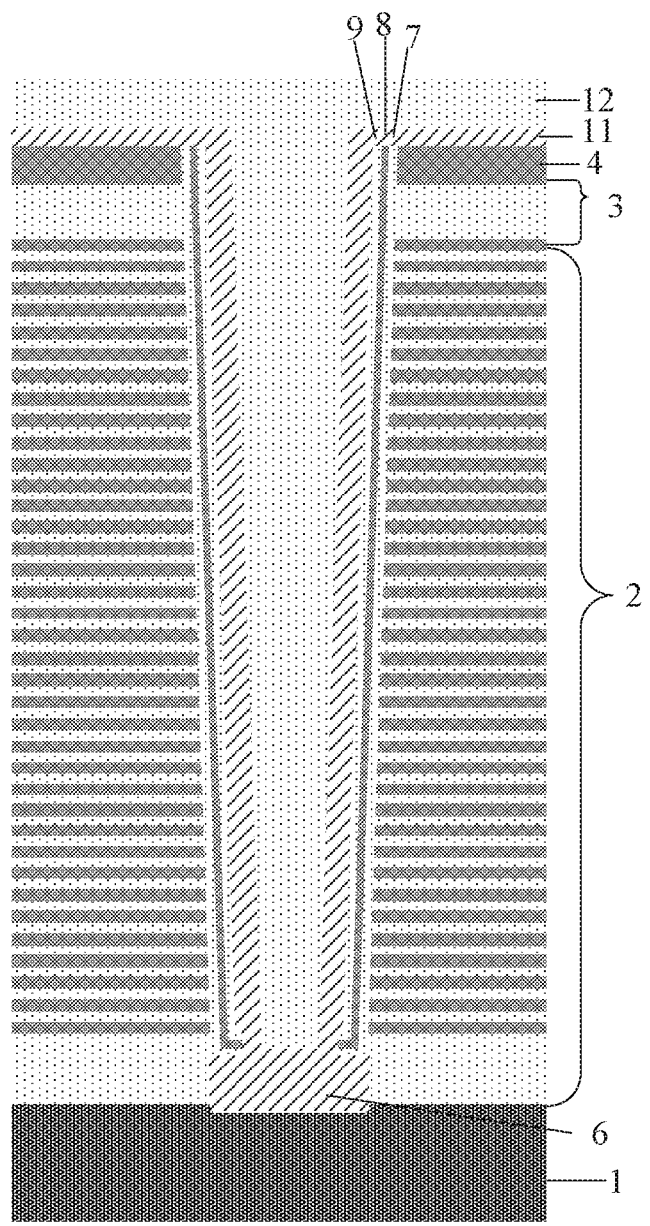

As shown in FIG. 2F, a first filling structure 12 can be formed to cover the first channel layer 11 and fill the first channel hole 5. In some embodiments, the first filling structure 12 can be an oxide layer formed by using a deposition process. In some embodiments, the first filling structure 12 can include one or more airgaps.

Figure 2G:
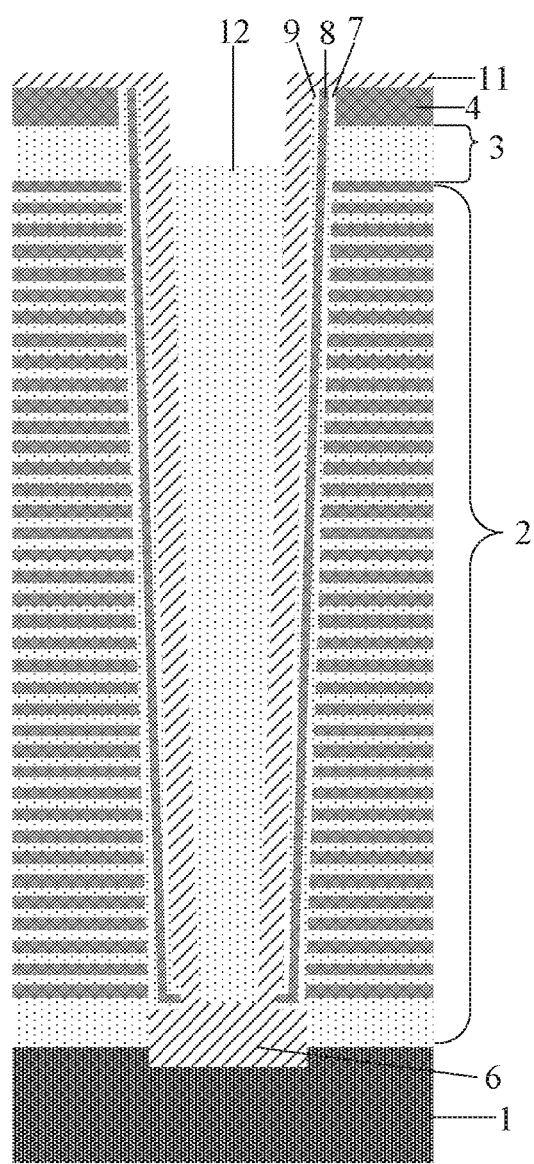

As shown in FIG. 2G, a portion of the first filling structure 12 can be removed (which is normally called "Etch Back"), so that the top surface of the remaining portion of the first filling structure 12 can be lower than the top surface of the first insulating layer 3 but higher than the bottom surface of the first insulating layer 3 for better device performance. In some embodiments, the portion of the first filling structure 12 can be removed by using a recess etching process including, but not limited to, a wet etching, a dry etching, or a combination thereof.

Figure 2H:
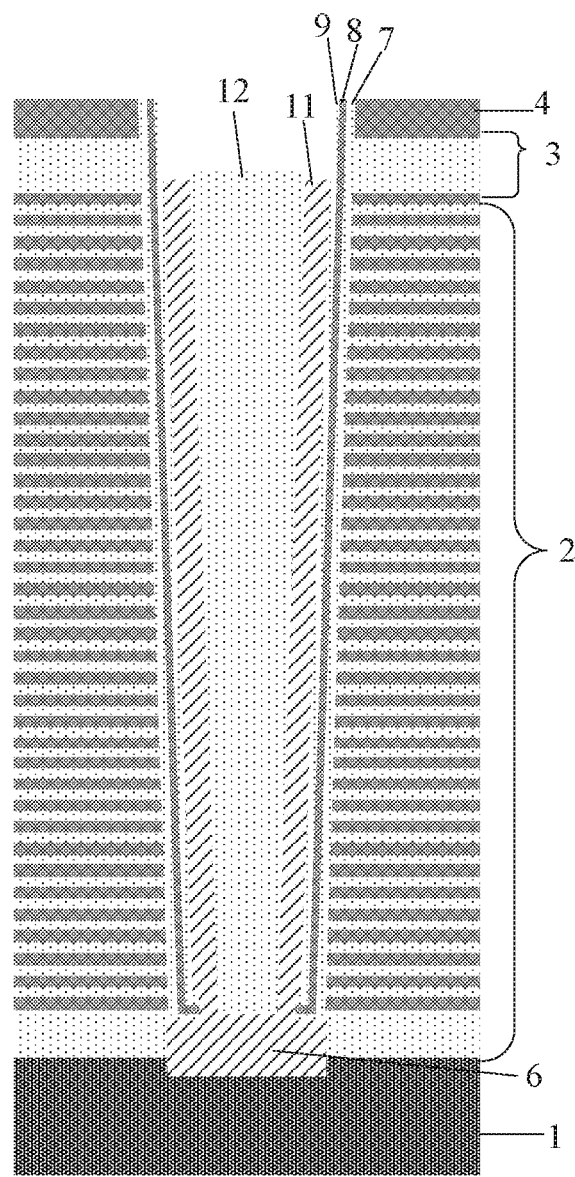

As shown in FIG. 2H, a portion of the first channel layer 11 can be removed, such that the surface of the remaining portion of the first channel layer 11 is lower than the first insulating layer 3. The remaining portion of the first channel layer 11 can be in contact with the epitaxial layer 6. In some embodiments, the portion of the first channel layer 11 can be removed by using any suitable etching process, such as a wet etching, a dry etching, or a combination thereof.

As shown in FIG. 1A, the method can process to operation S106, in which a first recess can be formed in the first insulating layer 3. In some embodiments, the projection of the first recess on the substrate 1 can completely cover the projection of the first channel hole 5 on the substrate 1.

Figure 2I:
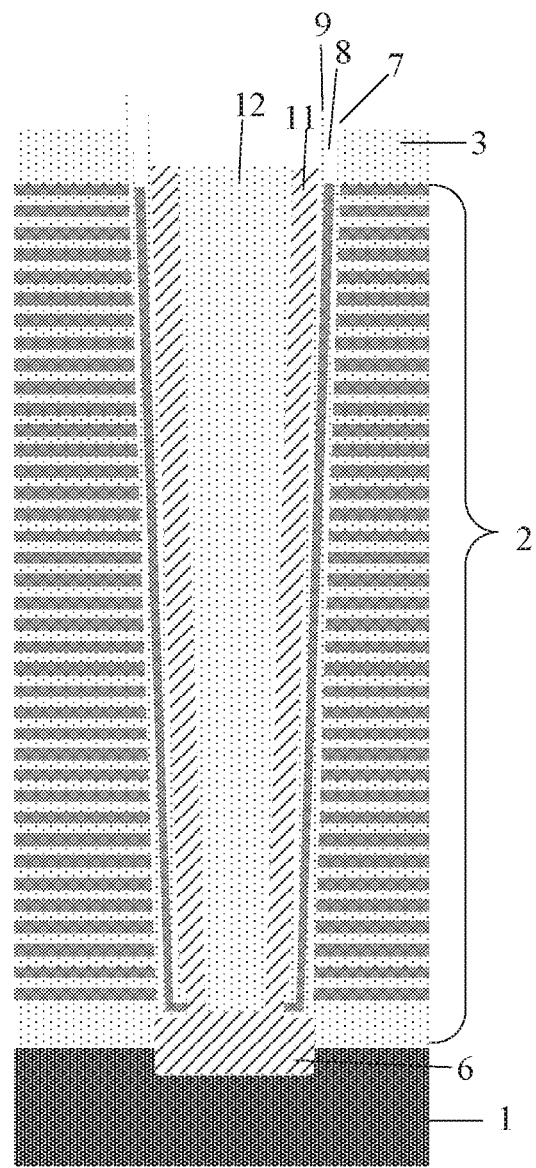

As shown in FIG. 2I, the nitride layer of the first hard mask layer 4 can be removed. In some embodiments, the nitride layer of the first hard mask layer 4 can be removed by using any suitable etching processes, such as a wet etching, a dry etching, or a combination thereof. In some embodiments, a portion the first storage layer 8 (nitride layer) on the sidewall of the first channel hole 5 can also be etched, such that a top surface of the first storage layer 8 is lower than the top surface of the first insulating layer 3.

Figure 2J:
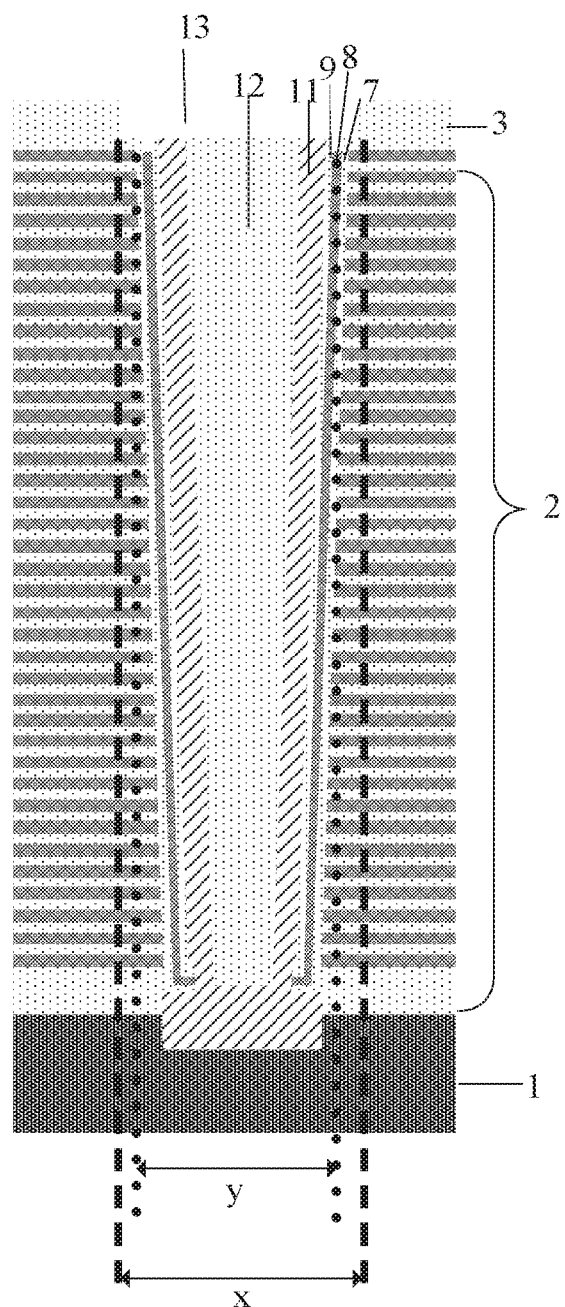

As shown in FIG. 2J, the surface of the first insulating layer 3 can be planarized by using any suitable techniques, such as backside grinding, chemical mechanical polishing (CMP), etc. A portion of the first insulating layer 3 can be removed to form the first recess 13 in the first insulating layer 3 by using any suitable etching process and cleaning process, such as a non-selective dry etching process and a following dilute hydrofluoric acid (HF) cleaning process.

In some embodiments, a projection of the first recess 13 on the substrate 1 can completely cover the projection of the first channel hole 5 on the substrate 1. In some embodiments, a diameter "x" of the first channel hole 5 can be in a range from 50 nm to 150 nm. In some embodiments, a difference between a diameter "x" of the first recess 13 and a maximum diameter "y" of the first channel hole 5 can be in a range from 10 nm to 30 nm. In some embodiments, a depth of the first recess can be equal to or less than the thickness of the planarized first insulating layer 3, as shown in FIG. 2J. For example, the depth of the first recess can be in a range between 10 nm and 100 nm. In one embodiment, the thickness of the planarized first insulating layer 3 can be in a range between 20 nm and 200 nm, while the depth of the first recess can be in a range between 10 nm and 100 nm.

Figure 2K:
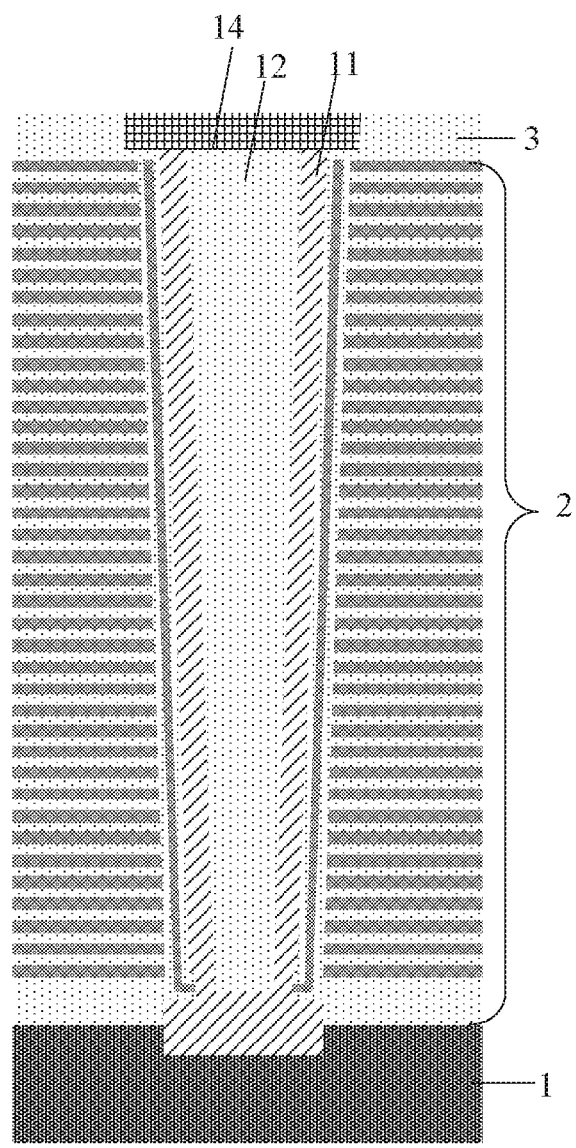

As shown in FIG. 1A, the method can process to operation S107, in which a sacrificial inter-deck plug 14 can be formed in the first recess 13. As shown in FIG. 2K, the sacrificial inter-deck plug 14 can be in contact with the channel layer but not with the first storage layer 8 nor with the top second dielectric layer 104. In some embodiments, the sacrificial inter-deck plug 14 can include any suitable semiconductor or conductive materials that can be used as an oxide and nitride etch stopper layer, including, but not limited to, tungsten (W), tungsten silicide (WSi$_x$), and/or tungsten nitride (WN$_x$), etc. The sacrificial inter-deck plug 14 can be formed by using any suitable deposition process, such as ALD, CVD, PVD, etc.

A thickness of the sacrificial inter-deck plug 14 can be equal to the depth of the first recess 13. As described above, in some embodiments, a thickness of the sacrificial inter-deck plug 14 can be equal to or less than the thickness of the planarized first insulating layer 3. For example, the thickness of the sacrificial inter-deck plug 14 can be in a range between 10 nm and 100 nm, preferably less than about 60 nm. In some embodiments, a diameter of the sacrificial inter-deck plug 14 can be in a range between 50 nm and 150 nm.

As shown in FIG. 1B, the method can process to operation S108, in which a second alternating dielectric stack 15, a second insulating layer 16 and a second hard mask stack 17 can be sequentially formed on the sacrificial inter-deck plug 14.

Figure 2L:
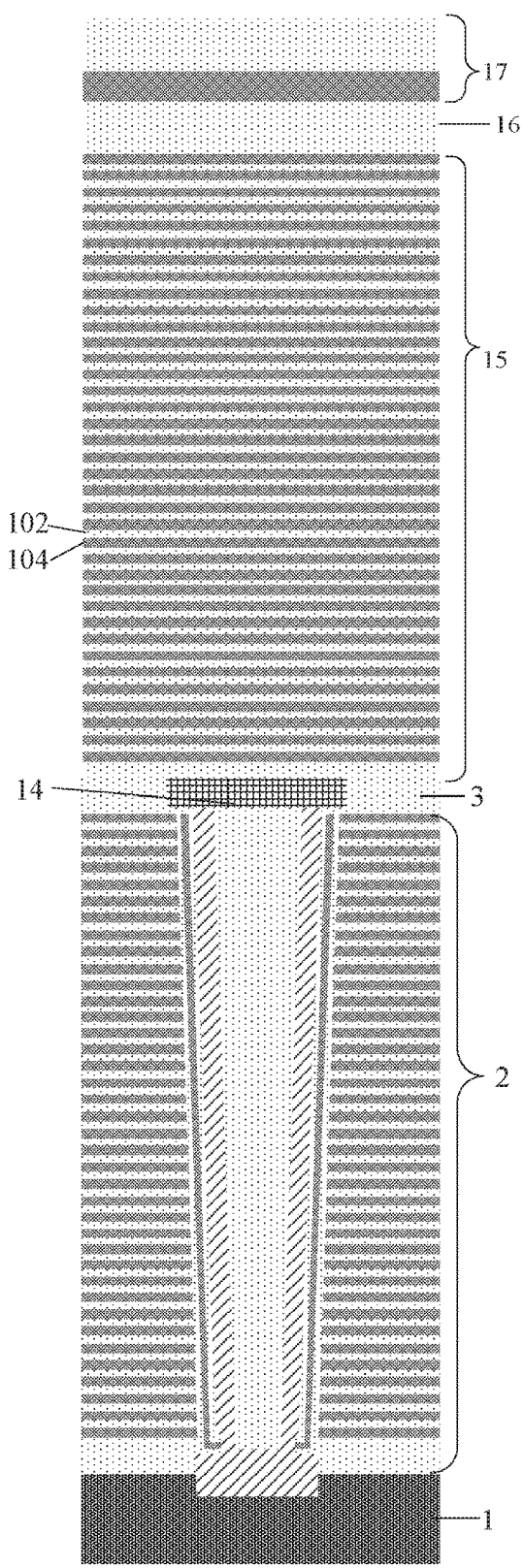

As shown in FIG. 2L, the second alternating dielectric stack 15 including a plurality of dielectric layer pairs can be formed on the first insulation connection layer 3 and the sacrificial inter-deck plug 14. The second alternating dielectric stack 15 can include an alternating stack of a first dielectric layer 102 and a second dielectric layer 104 that is different from first dielectric layer. The plurality of first dielectric layers 102 and second dielectric layers 104 are extended in a lateral direction that is parallel to a surface of the substrate 1. In some embodiments, there are more layers than the dielectric layer pairs made of different materials and with different thicknesses in the second alternating dielectric stack 15. The second alternating dielectric stack 15 can be formed by one or more thin film deposition processes including, but not limited to, Chemical Vapor Deposition (CVD), Physical Vapor Deposition (PVD), Atomic Layer Deposition (ALD), or any combination thereof.

In some embodiments, the second alternating dielectric stack 15 can include a plurality of oxide/nitride layer pairs. Each dielectric layer pair includes a layer of silicon oxide 102 and a layer of silicon nitride 104. The plurality of oxide/nitride layer pairs are also referred to herein as an "alternating oxide/nitride stack." That is, in the second alternating dielectric stack 15, multiple oxide layers 102 (shown in the areas with dotes) and multiple nitride layers 104 (shown in the areas with meshes) alternate in a vertical direction. In other words, except a top and a bottom layer of a given alternating oxide/nitride stack, each of the other oxide layers 102 can be sandwiched by two adjacent nitride layers 104, and each of the nitride layers 104 can be sandwiched by two adjacent oxide layers 102. In some embodiments, a lowest layer of the second alternating dielectric stack 15 is an oxide layer.

Oxide layers can each have the same thickness or have different thicknesses. For example, a thickness of each oxide layer can be in a range from 10 nm to 100 nm, preferably about 30 nm. Similarly, nitride layers can each have the same thickness or have different thicknesses. For example, a thickness of each nitride layer can be in a range from 10 nm to 100 nm, preferably about 35 nm.

The second alternating dielectric stack 15 can include any suitable number of layers of the oxide layers 102 and the nitride layers 104. In some embodiments, a total number of layers of the oxide layers 102 and the nitride layers 104 in the second alternating dielectric stack 15 is equal to or larger than 64. That is, a number of oxide/nitride layer pairs can be equal to or larger than 32. In some embodiments, alternating oxide/nitride stack includes more oxide layers or more nitride layers with different materials and/or thicknesses than the oxide/nitride layer pair.

The second insulating layer 16 can be formed on the second alternating dielectric stack 15. In some embodiments, the second insulating layer 16 can be made by any suitable insulating material and/or dielectric material, such as silicon oxide. It is noted that, the material of the second insulating layer 16 can be different from the material of the nitride layer in the second alternating dielectric stack 15.

The second insulating layer 16 can be formed on the top surface of the second alternating dielectric stack 15.

Further, in some embodiments, a second mask layer 17 can be formed on the top surface of the second insulating layer 16. The second mask layer 17 can include a nitride layer on the top surface of the second insulating layer 16, and an oxide layer on the top surface of such nitride layer. The nitride layer of the second mask layer 17 can be a silicon nitride layer.

In some embodiments, the second alternating dielectric stack 15, the second insulating layer 16, and/or the second mask layer 17 can be formed by using one or more deposition processes. It is noted that, the term "deposition process" used in the present disclosure can be referred to any suitable deposition process including, but not limited to, a chemical vapor deposition (CVD) process, a physical vapor deposition (PVD) process, an atomic layer deposition (ALD) process, and/or any suitable combination thereof.

Figure 2M:
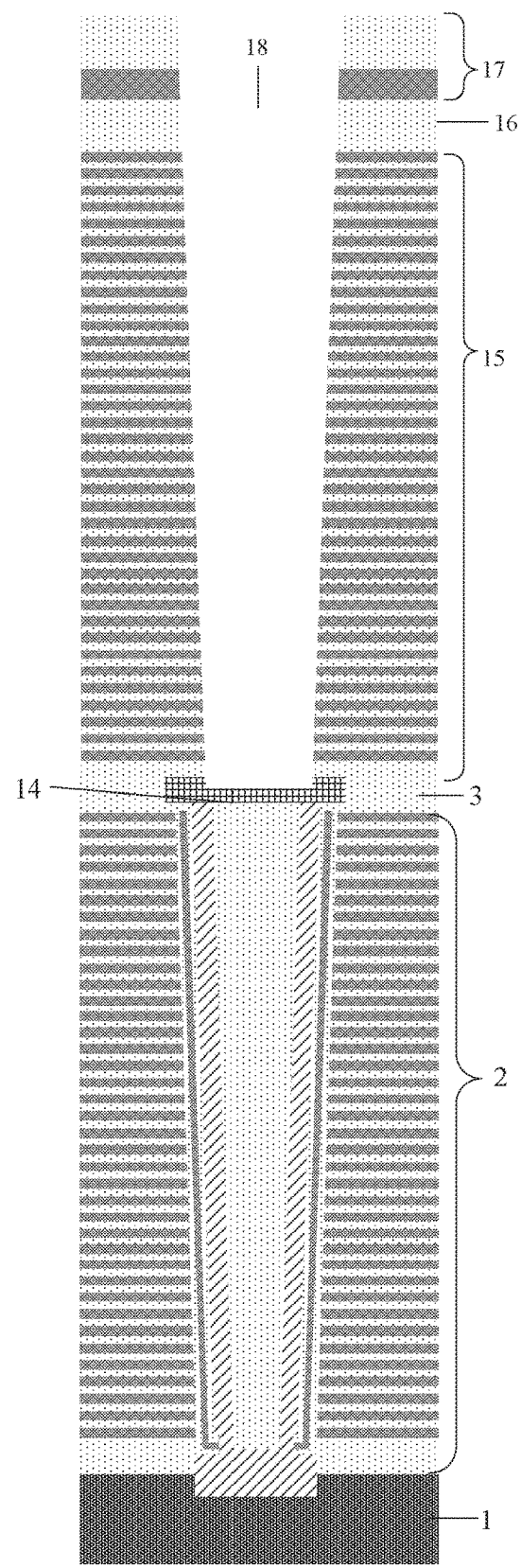

As shown in FIG. 1B, the method can process to operation S109, in which a second channel hole 18 is formed. As shown in FIG. 2M, the second channel hole 18 can completely penetrate the second alternating dielectric stack 15 and the second insulating layer 16, and can expose the surface of the sacrificial inter-deck plug 14 or extend into the sacrificial inter-deck plug 14. The projection of the second channel hole 18 on the substrate 1 can at least partially overlap with the projection of the first channel hole 5 on the substrate 1.

In some embodiments, the second alternating dielectric stack 15, the second insulating layer 16, and the second mask layer 17 can be etched to form the second channel hole 18. The second alternating dielectric stack 15, the second insulating layer 16, and the second mask layer 17, can be etched by using a dry etching process, a wet etching process, or a combination thereof. A cleaning process can then be performed to clean the second channel hole 18.

It is noted that, the second channel hole 18 can expose the surface of the sacrificial inter-deck plug 14, or can extend into the sacrificial inter-deck plug 14. As such, the sacrificial inter-deck plug 14 can be removed in a subsequent process.

As shown in FIG. 1B, the method can process to operation S1010, in which a second functional layer can be formed on the sidewall and bottom of the second channel hole 18. In some embodiments, the second functional layer can include a second barrier layer 19, a second storage layer 20, a second tunneling layer 21, and a second passivation layer 22.

Figure 2N:
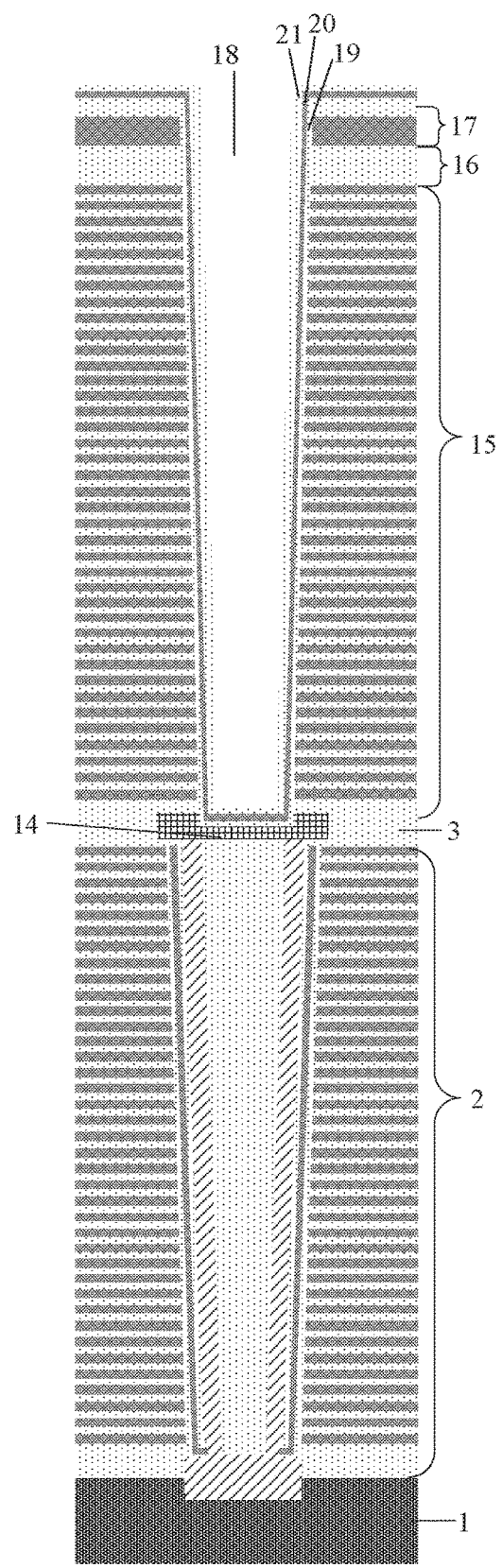

As shown in FIG. 2N, the second barrier layer 19 can be formed on the sidewall of the second channel hole 18. The second barrier layer 19 can be used for blocking the outflow of the electronic charges. In some embodiments, the second barrier layer 19 can be an oxide layer formed by using a deposition process.

The second storage layer 20 can be formed on the surface of the second barrier layer 19. The second storage layer 20 can be used for storing electronic charges. In some embodiments, the second storage layer 20 can be a nitride layer formed by using a deposition process.

The second tunneling layer 21 can be formed on the surface of the second storage layer 20. The second tunneling layer 21 can be used for generating electronic charges. In some embodiments, the second tunneling layer 21 can be an oxide layer formed by using a deposition process.

Figure 2O:
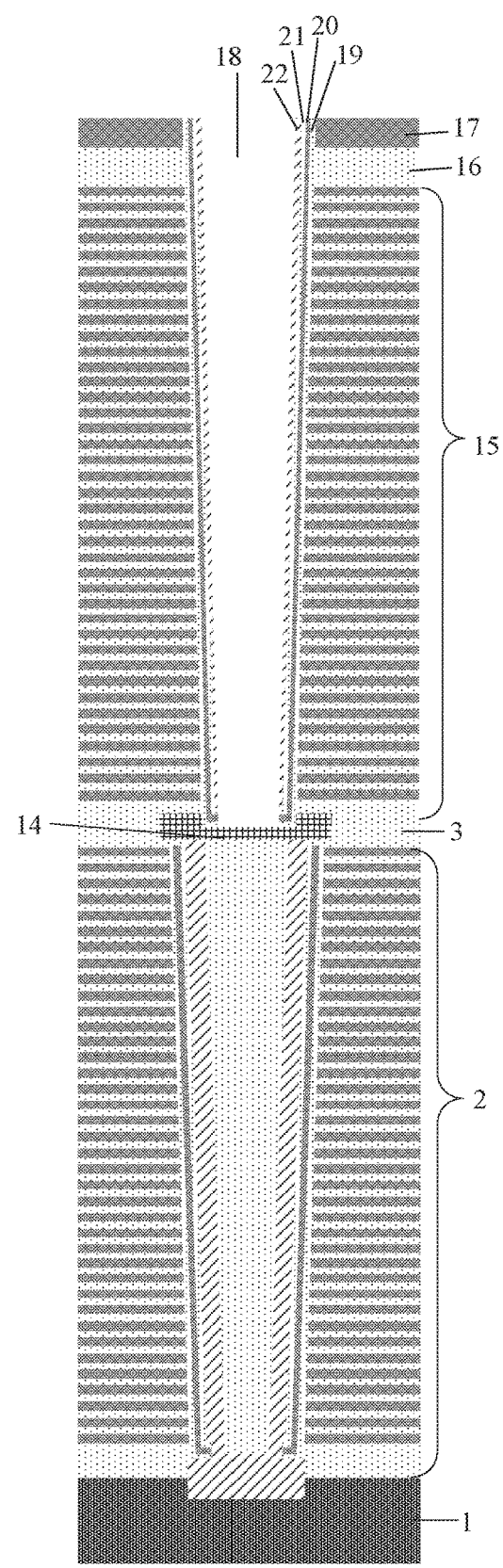

As shown in FIG. 2O, a second passivation layer 22 can be formed on the surface of the second tunneling layer 21. The second passivation layer 22 can be used for protecting the second tunneling layer 21 from being damaged in a subsequent removal process. In some embodiments, the second passivation layer 22 can be an amorphous silicon layer formed by using a deposition process.

As shown in FIG. 2O, the portions of the second passivation layer 22, the second tunneling layer 21, the second storage layer 20 and the second barrier layer 19 that are located on the surface of the sacrificial inter-deck plug 14 can be removed. In some embodiments, the removal process can include an etching process and a cleaning process. In some embodiments, the portions of the second passivation layer 22, the second tunneling layer 21, the second storage layer 20, the second barrier layer 19, the oxide layer of the second mask layer 17 that are located on the nitride layer of the second mask layer 17 can also be removed by using an etching process. As such, the second functional layer can be formed on the sidewall of the second channel hole 18.

Figure 2P:
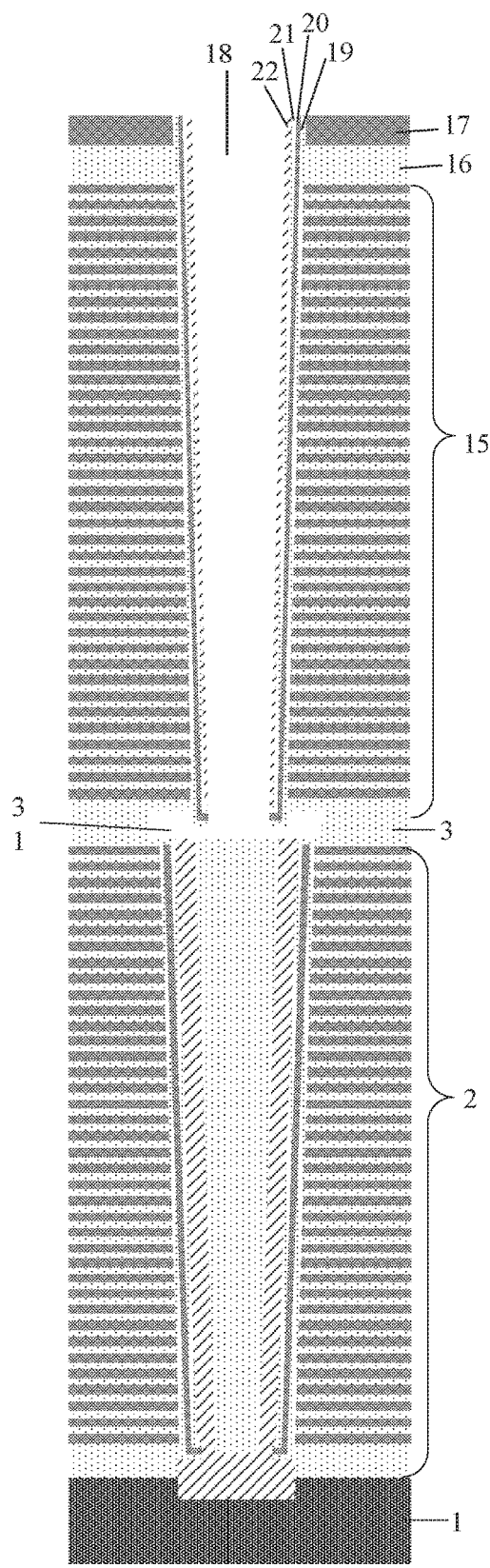

As shown in FIG. 1B, the method can process to operation S1011, in which the sacrificial inter-deck plug 14 can be removed to form a cavity. As shown in FIG. 2P, the sacrificial inter-deck plug 14 can be removed by using any suitable etching process, such as a selective wet etching process. As such, a cavity 31 can be formed in the first insulating layer 3.

As shown in FIG. 1B, the method can process to operation S1012, in which a second channel layer can be formed on the sidewall of the second functional layer, and an inter-deck channel plug can be formed to fill the cavity. Further, a second filling structure can be formed to fill the second channel hole.

Figure 2Q:
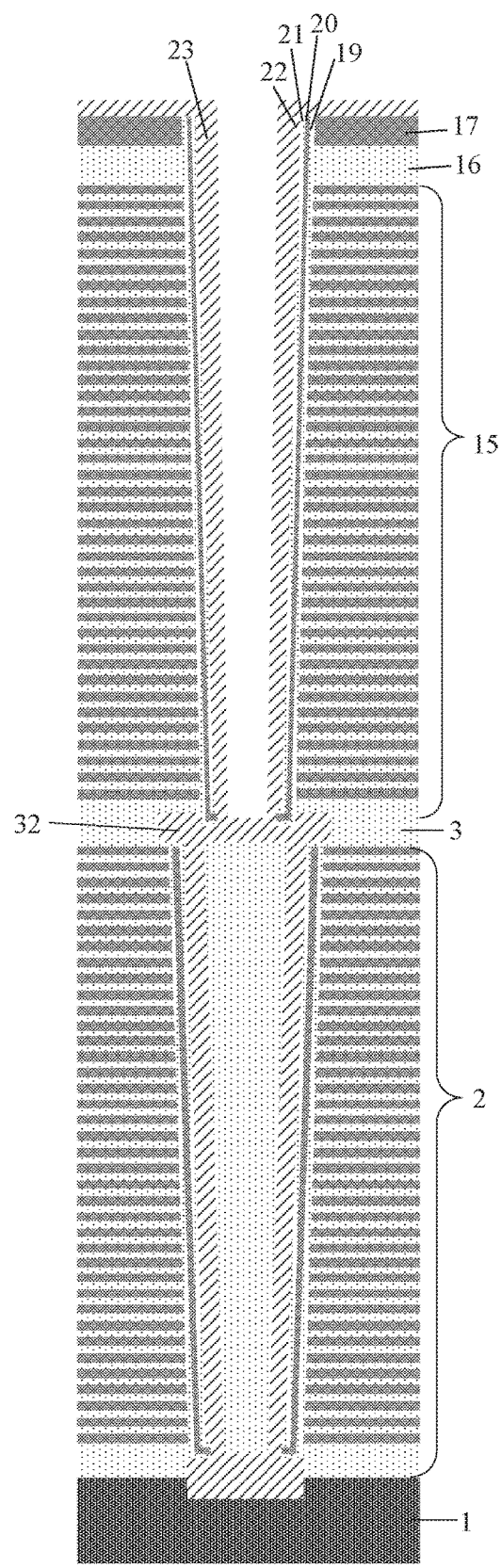

As shown in FIG. 2Q, the second channel layer 23 can be formed to cover the sidewall of the second passivation layer 22, and the inter-deck channel plug 32 can be formed to fill the cavity 31 formed by removing the sacrificial inter-deck plug 14. As such, the inter-deck channel plug 32 can contact both the second channel layer 23 and the first channel layer 11. In some embodiments, the second channel layer 23 can also cover the surface of the second insulating layer 16, or the surface of the nitride layer of the second mask layer 17. In some embodiments, the second channel layer 23 and the inter-deck channel plug 32 can be an amorphous silicon layer or polysilicon layer formed by using a single deposition process. Thus, they can said to be formed simultaneously. A thickness of the inter-deck channel plug 32 can be in a range from 40 nm to 70 nm, preferably less than about 60 nm.

Figure 2R:
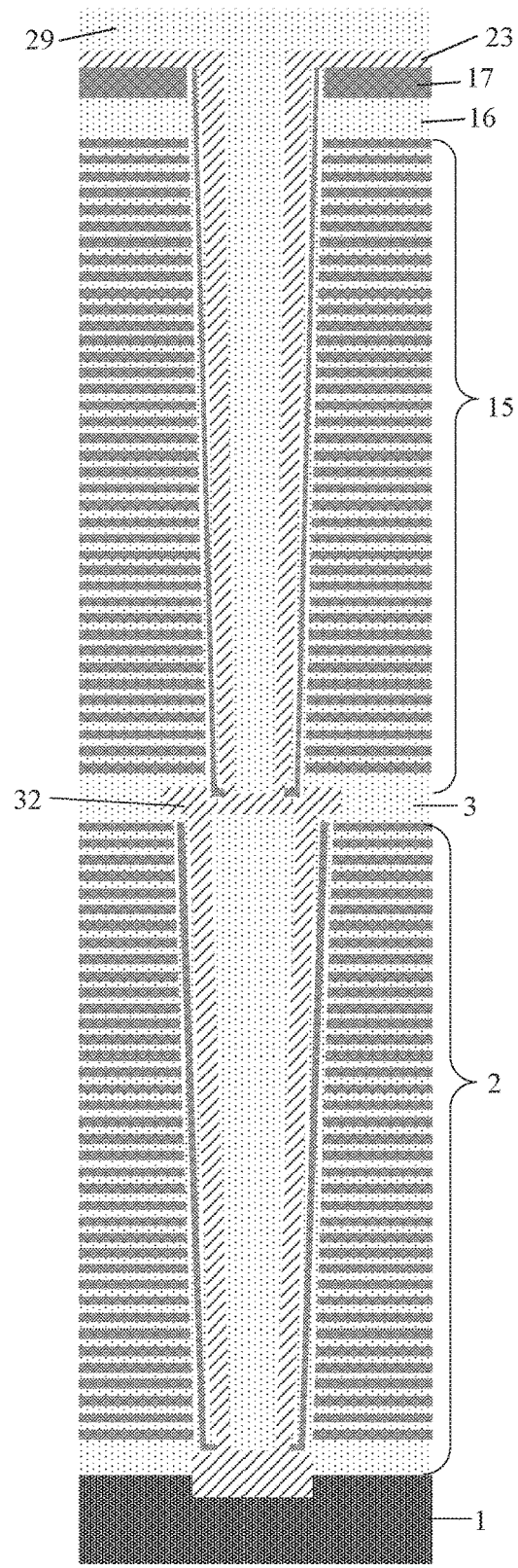
Figure 2S:
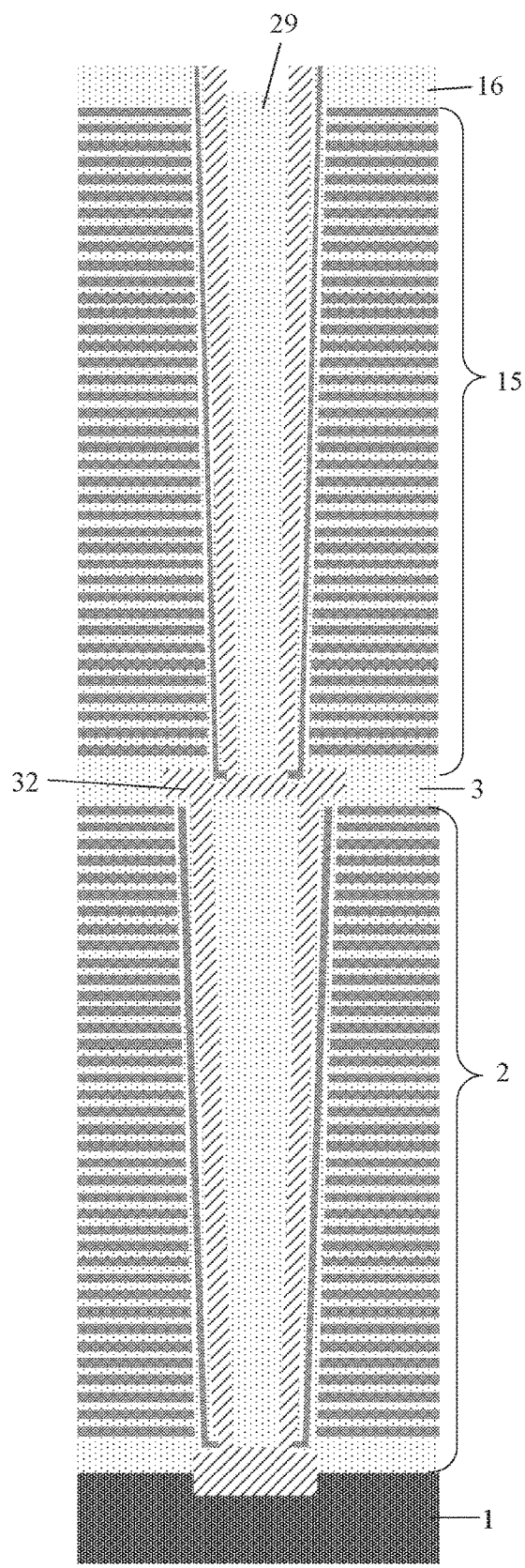
Figure 2T:
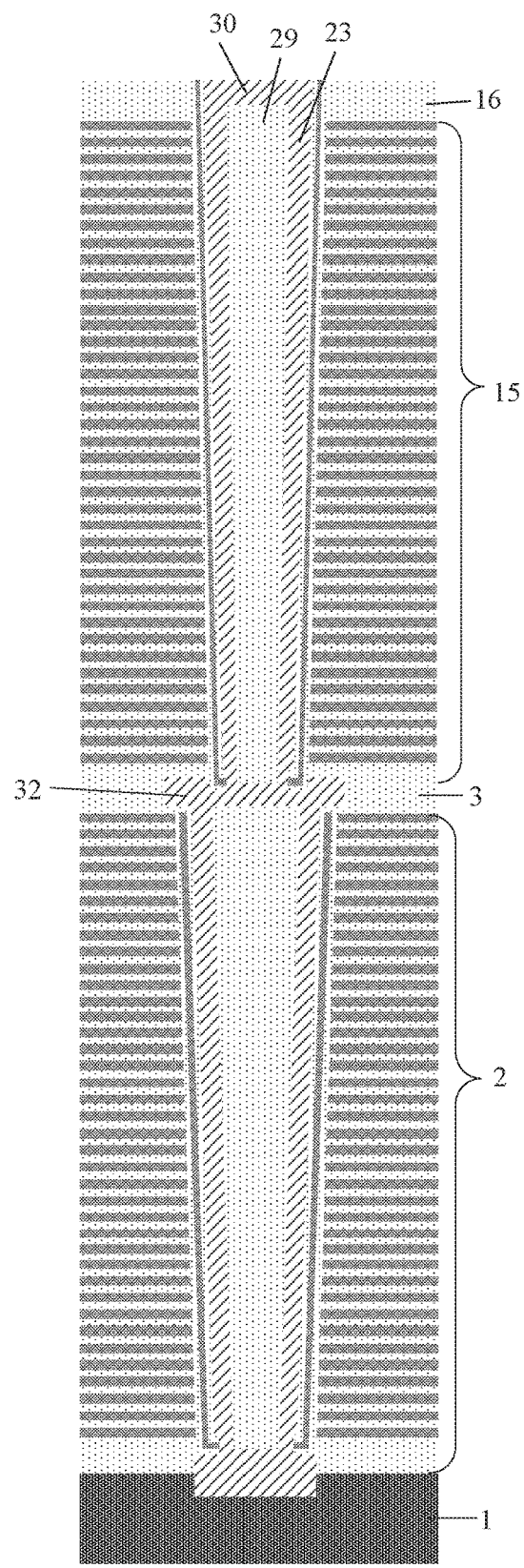

As shown in FIG. 1B, the method can process to operation S1013, in which second filling structure can be formed to fill the second channel hole. As shown in FIG. 2R, a second filling structure 29 can be formed to cover the second channel layer 23 and to fill the second channel hole 18. In some embodiments, the second filling structure 29 can be an oxide layer formed by using a deposition process. As shown in FIG. 2S, a portion of the second filling structure 29 can be removed, such that the surface of the second filling structure 29 is lower than the surface of the second insulating layer 16. In some embodiments, the removal process can include an etching process.

As shown in FIG. 2S, the portion of the second channel layer 23 located on the surface of the second insulating layer 16 or the surface of the second mask layer 17 can be removed. In some embodiments, the removal process can include an etching process. The top surface of the remaining portion of the second channel layer 23 can be higher than the top surface of the second filling structure 29. As such, a second recess can be formed on the fourth channel structure and the second filling structure, and in the second channel hole 18. In some embodiments, the nitride layer of the second mask layer 17 can also be removed by any suitable etching process.

As shown in FIG. 1B, the method can process to operation S1014, in which a top channel plug can be formed in the second recess. As shown in FIG. 2T, the top channel plug 30 can be formed in the second recess that is on the second filling structure 29 and in contact with the second channel layer 23. The top surface of the second insulating layer 16 and the top surface of the top channel plug 30 can be planarized by any suitable techniques, such as backside grinding, and/or chemical mechanical polishing (CMP).

Further, it is noted that, subsequent processes can be performed to further fabricate the 3D memory device. For example, a metal via can be formed on the top channel plug 30 for electronically connecting the top channel plug 30 to back end of line (BEOL) metal lines, such as bit lines of double patterning structure.

In some embodiments, a gate replacement process (also known as the "word line replacement" process) can be performed to replace second dielectric layers 104 (e.g., silicon nitride) of the first alternating dielectric stack 2 and the second alternating dielectric stack 15 with conductor layers (e.g., W). As a result, after the gate replacement process, the alternating dielectric stacks can become alternating conductor/dielectric stacks. The replacement of second dielectric layers 104 with conductor layers can be performed by wet etching first dielectric layers (e.g., silicon nitride) selective to second dielectric layers (e.g., silicon oxide) and filling the structure with conductor layers (e.g., W). Conductor layers can be filled by PVD, CVD, ALD, any other suitable process, or any combination thereof. Conductor layers can include conductive materials including, but not limited to, W, Co, Cu, Al, polysilicon, silicides, or any combination thereof.

In some embodiments, during the replacement process, a portion of the inter-deck channel plug 32 that is adjacent with the bottom nitride layer of the second alternating dielectric stack 15, or is adjacent with the top nitride layer of the first alternating dielectric stack 2 can be converted to an oxide layer by an oxidation process. For example, an etching process can be performed to remove all nitride layers in the first alternating dielectric stack 2 and the second alternating dielectric stack 15. Then an oxide process can be formed to oxide the exposed surface of inter-deck channel plug 32. As a result, a portion of the inter-deck channel plug 32 can be converter to the oxide layer. In some embodiments, a thickness of the inter-deck channel plug 32 can be reduced after the replacement process. For example, the thickness inter-deck channel plug 32 can be reduced to a range between 30 nm and 60 nm.

Accordingly, a method for forming a dual-deck channel hole structure of a 3D memory device is disclosed. By combining two channel hole formation processes, and forming an inter-deck channel plug, a dual-deck channel hole structure having a large aspect ratio and a limited top-bottom aperture error can be formed. By forming a sacrificial inter-deck plug and replacing the sacrificial inter-deck plug with the inter-deck channel plug, under the condition that the inter-deck channel plug has a robust structure strength, a thickness of the inter-deck channel plug can be controlled within a desired range, such as less than 60 nm. As such, the channel mobility and the string current of the 3D memory device can be significantly improved. Further, a diameter of the inter-deck channel plug can be enlarged to ensure a more tolerate etch margin, which results in an efficient process capability control, a simplified process complexity, and a reduced cost.

The method for forming a dual-deck channel hole structure of a 3D memory device can include: forming a first alternating dielectric stack on a substrate; forming a first insulating layer on the first alternating dielectric stack; forming a first channel hole penetrating the first insulating layer and the first alternating dielectric stack; forming a first channel structure in the first channel hole; forming a sacrificial inter-deck plug in the first insulating layer, wherein a projection of the sacrificial inter-deck plug in a lateral plane covers a projection of the first channel hole in the lateral plane; forming a second alternating dielectric stack disposed on the sacrificial inter-deck plug; forming a second channel hole penetrating the second alternating dielectric stack and expose a portion of the sacrificial inter-deck plug; removing the sacrificial inter-deck plug to form a cavity; and forming an inter-deck channel plug in the cavity and a second channel structure in the second channel hole, wherein the inter-deck channel plug contacts the first channel structure and the second channel structure.

In some embodiments, the method further comprises: forming at least 32 dielectric layer pairs stacked in a vertical direction, wherein each dielectric layer pair includes a first dielectric layer and a second dielectric layer that is different from the first dielectric layer.

In some embodiments, the method further comprises: forming at least 32 dielectric layer pairs stacked in a vertical direction, wherein each dielectric layer pair includes a silicon oxide layer and a silicon nitride layer.

In some embodiments, the method further comprises: forming an oxide layer on the first alternating dielectric stack as the first insulating layer; and forming a nitride layer on the oxide layer as a first mask layer.

In some embodiments, the method further comprises: before forming the first channel structure, forming an epitaxial layver on a surface of the substrate that is exposed by the first channel hole.

In some embodiments, forming the first channel structure comprises: forming a first functional layer on a sidewall of the first channel hole; forming a first channel layer covering a sidewall of the functional layer, the first channel layer being in contact with the epitaxial layer; and forming a first filling structure to cover a sidewall of the first channel layer and filling the first channel hole.

In some embodiments, forming the first functional layer comprises: forming a first barrier layer on the sidewall of the first channel hole for blocking an outflow of electronic charges; forming a first storage layer on a surface of the first barrier layer for storing electronic charges during operation of the 3D memory device; and forming a first tunneling layer on a surface of the first storage layer for tunneling electronic charges.

In some embodiments, forming the sacrificial inter-deck plug comprises: forming a first recess in the first insulating layer, wherein a projection of the first recess in the lateral plane covers a projection of the first channel hole in the lateral plane; forming an oxide and nitride etch stopper layer in the first recess, the oxide and nitride etch stopper layer be in contact with the first channel layer; and removing a portion of the oxide and nitride etch stopper layer that is outside of the recess to form the sacrificial inter-deck plug, and to planarize a top surface of the sacrificial inter-deck plug.

In some embodiments, the method further comprises: forming the sacrificial inter-deck plug comprises: depositing a material including tungsten, tungsten silicide, or tungsten nitride to form the oxide and nitride etch stopper layer.

In some embodiments, removing the sacrificial inter-deck plug comprises: performing a selective wet etching process to etch the sacrificial inter-deck plug through the second channel hole.

In some embodiments, before removing the sacrificial inter-deck plug, the method further comprises: forming a second functional layer on a sidewall of the second channel hole and on a surface of the sacrificial inter-deck plug exposed by the second channel hole; and removing a portion of the second functional layer that is on a surface of the sacrificial inter-deck plug.

In some embodiments, forming the second functional layer comprises: forming a second barrier layer on the sidewall of the second channel hole for blocking an outflow of the electronic charges; forming a second storage layer on a surface of the second barrier layer for storing electronic charges during operation of the 3D memory device; and forming a second tunneling layer on a surface of the second storage layer for tunneling electronic charges.

In some embodiments, forming the inter-deck channel plug comprises: forming the inter-deck channel plug in the cavity by a deposition process, wherein the inter-deck channel plug contacts the first channel layer.

In some embodiments, forming the second channel structure in the first channel hole comprises: forming the second channel layer on a surface of the second functional layer by a deposition process, wherein the second channel structure contacts the inter-deck channel plug.

In some embodiments, forming the inter-deck channel plug in the cavity and the second channel structure in the first channel hole comprises: forming the inter-deck channel plug and the second channel structure in a single deposition process.

In some embodiments, forming the inter-deck channel plug comprises: forming the inter-deck channel plug having a thickness less than 60 nm.

In some embodiments, forming the second channel structure further comprises: forming a second filling structure to cover a sidewall of the second channel layer and filling the second channel hole.

In some embodiments, the method further comprises: removing a portion of the second filling structure a second recess in the second channel hole; and forming a top channel plug in the second recess, the top channel plug being in contact with the second channel layer.

In some embodiments, the method further comprises: replacing the second dielectric layers in the first alternating dielectric stack and the second alternating dielectric stack with conductor layers.

In some embodiments, the method further comprises: reducing a thickness of the inter-deck channel plug during replacing the second dielectric layers in the first alternating dielectric stack and the second alternating dielectric stack with conductor layers.

The foregoing description of the specific embodiments will so fully reveal the general nature of the present disclosure that others can, by applying knowledge within the skill of the art, readily modify and/or adapt for various applications such specific embodiments, without undue experimentation, without departing from the general concept of the present disclosure. Therefore, such adaptations and modifications are intended to be within the meaning and range of equivalents of the disclosed embodiments, based on the teaching and guidance presented herein. It is to be understood that the phraseology or terminology herein is for the purpose of description and not of limitation, such that the terminology or phraseology of the present specification is to be interpreted by the skilled artisan in light of the teachings and guidance.

Embodiments of the present disclosure have been described above with the aid of functional building blocks illustrating the implementation of specified functions and relationships thereof. The boundaries of these functional building blocks have been arbitrarily defined herein for the convenience of the description. Alternate boundaries can be defined so long as the specified functions and relationships thereof are appropriately performed.

The Summary and Abstract sections may set forth one or more but not all exemplary embodiments of the present disclosure as contemplated by the inventor(s), and thus, are not intended to limit the present disclosure and the appended claims in any way.

The breadth and scope of the present disclosure should not be limited by any of the above-described exemplary embodiments, but should be defined only in accordance with the following claims and their equivalents.

What is claimed is:

1. A method for forming a channel hole structure in a three-dimensional (3D) memory device, comprising:
    forming a first alternating dielectric stack on a substrate;
    forming a first insulating layer on the first alternating dielectric stack;
    forming a first channel hole penetrating the first insulating layer and the first alternating dielectric stack;
    forming a first channel structure in the first channel hole;
    forming a sacrificial inter-deck plug in the first insulating layer, wherein a projection of the sacrificial inter-deck plug in a lateral plane covers a projection of the first channel hole in the lateral plane;
    forming a second alternating dielectric stack disposed on the sacrificial inter-deck plug;
    forming a second channel hole penetrating the second alternating dielectric stack and expose a portion of the sacrificial inter-deck plug;
    removing the sacrificial inter-deck plug to form a cavity; and
    forming an inter-deck channel plug in the cavity and a second channel structure in the second channel hole, wherein the inter-deck channel plug contacts the first channel structure and the second channel structure.

2. The method of claim 1, wherein at least one of forming the first alternating dielectric stack and forming the second alternating dielectric stack comprises:
    forming at least 32 dielectric layer pairs stacked in a vertical direction, wherein each dielectric layer pair includes a first dielectric layer and a second dielectric layer that is different from the first dielectric layer.

3. The method of claim 1, wherein at least one of forming the first alternating dielectric stack and forming the second alternating dielectric stack comprises:
    forming at least 32 dielectric layer pairs stacked in a vertical direction, wherein each dielectric layer pair includes a silicon oxide layer and a silicon nitride layer.

4. The method of claim 1, further comprising:
    forming an oxide layer on the first alternating dielectric stack as the first insulating layer; and
    forming a nitride layer on the oxide layer as a first mask layer.

5. The method of claim 1, further comprising:
    before forming the first channel structure, forming an epitaxial layer on a surface of the substrate that is exposed by the first channel hole.

6. The method of claim 5, wherein forming the first channel structure comprises:
forming a first functional layer on a sidewall of the first channel hole;
forming a first channel layer covering a sidewall of the functional layer, the first channel layer being in contact with the epitaxial layer; and
forming a first filling structure to cover a sidewall of the first channel layer and filling the first channel hole.

7. The method of claim 6, wherein forming the first functional layer comprises:
forming a first barrier layer on the sidewall of the first channel hole for blocking an outflow of electronic charges;
forming a first storage layer on a surface of the first barrier layer for storing electronic charges during operation of the 3D memory device; and
forming a first tunneling layer on a surface of the first storage layer for tunneling electronic charges.

8. The method of claim 6, wherein forming the sacrificial inter-deck plug comprises:
forming a first recess in the first insulating layer, wherein a projection of the first recess in the lateral plane covers a projection of the first channel hole in the lateral plane;
forming an oxide and nitride etch stopper layer in the first recess, the oxide and nitride etch stopper layer be in contact with the first channel layer;
removing a portion of the oxide and nitride etch stopper layer that is outside of the recess to form the sacrificial inter-deck plug, and to planarize a top surface of the sacrificial inter-deck plug.

9. The method of claim 6, wherein forming the sacrificial inter-deck plug comprises:
depositing a material including tungsten, tungsten silicide, or tungsten nitride to form the oxide and nitride etch stopper layer.

10. The method of claim 6, before removing the sacrificial inter-deck plug, further comprising:
forming a second functional layer on a sidewall of the second channel hole and on a surface of the sacrificial inter-deck plug exposed by the second channel hole; and
removing a portion of the second functional layer that is on a surface of the sacrificial inter-deck plug.

11. The method of claim 10, wherein forming the second functional layer comprises:
forming a second barrier layer on the sidewall of the second channel hole for blocking an outflow of the electronic charges;
forming a second storage layer on a surface of the second barrier layer for storing electronic charges during operation of the 3D memory device; and
forming a second tunneling layer on a surface of the second storage layer for tunneling electronic charges.

12. The method of claim 10, wherein forming the inter-deck channel plug comprises:
forming the inter-deck channel plug in the cavity by a deposition process, wherein the inter-deck channel plug contacts the first channel layer.

13. The method of claim 12, wherein forming the second channel structure in the first channel hole comprises:
forming the second channel layer on a surface of the second functional layer by a deposition process, wherein the second channel structure contacts the inter-deck channel plug.

14. The method of claim 10, wherein forming the inter-deck channel plug in the cavity and the second channel structure in the first channel hole comprises:
forming the inter-deck channel plug and the second channel structure in a single deposition process.

15. The method of claim 14, wherein forming the second channel structure further comprises:
forming a second filling structure to cover a sidewall of the second channel layer and filling the second channel hole.

16. The method of claim 15, further comprising:
removing a portion of the second filling structure a second recess in the second channel hole; and
forming a top channel plug in the second recess, the top channel plug being in contact with the second channel layer.

17. The method of claim 10, wherein forming the inter-deck channel plug comprises:
forming the inter-deck channel plug having a thickness less than 60 nm.

18. The method of claim 1, wherein removing the sacrificial inter-deck plug comprises:
performing a selective wet etching process to etch the sacrificial inter-deck plug through the second channel hole.

19. The method of claim 1, further comprising:
replacing the second dielectric layers in the first alternating dielectric stack and the second alternating dielectric stack with conductor layers.

20. The method of claim 19, further comprising:
reducing a thickness of the inter-deck channel plug during replacing the second dielectric layers in the first alternating dielectric stack and the second alternating dielectric stack with conductor layers.

* * * * *